United States Patent
Iizuka et al.

(10) Patent No.: US 12,040,813 B2
(45) Date of Patent: Jul. 16, 2024

(54) INTEGRATING ANALOG-TO-DIGITAL CONVERTER AND SEMICONDUCTOR DEVICE

(71) Applicant: RENESAS ELECTRONICS CORPORATION, Tokyo (JP)

(72) Inventors: Yoichi Iizuka, Tokyo (JP); Fukashi Morishita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 161 days.

(21) Appl. No.: 17/886,033

(22) Filed: Aug. 11, 2022

(65) Prior Publication Data

US 2023/0087101 A1 Mar. 23, 2023

(30) Foreign Application Priority Data

Sep. 22, 2021 (JP) .................................. 2021-154059

(51) Int. Cl.
| | |
|---|---|
| H03M 1/36 | (2006.01) |
| H03K 23/44 | (2006.01) |
| H03K 23/54 | (2006.01) |
| H03M 1/08 | (2006.01) |
| H03M 1/50 | (2006.01) |

(52) U.S. Cl.
CPC ............ H03M 1/368 (2013.01); H03K 23/44 (2013.01); H03K 23/542 (2013.01); H03M 1/0872 (2013.01); H03M 1/50 (2013.01)

(58) Field of Classification Search
CPC ...... H03M 1/368; H03M 1/0872; H03M 1/50; H03M 1/123; H03M 1/14; H03M 1/56
See application file for complete search history.

(56) References Cited

U.S. PATENT DOCUMENTS

| | | | | |
|---|---|---|---|---|
| 5,230,013 | A | * 7/1993 | Hanke | ...................... H03L 7/18 |
| | | | | 326/73 |
| 6,147,532 | A | * 11/2000 | Ueda | ...................... H03K 5/133 |
| | | | | 327/158 |
| 2003/0137326 | A1* | 7/2003 | Okada | .................. H03D 13/004 |
| | | | | 327/108 |
| 2005/0001665 | A1* | 1/2005 | Lin | ........................ H03K 5/133 |
| | | | | 327/238 |

(Continued)

FOREIGN PATENT DOCUMENTS

JP 2008-092091 A 4/2008

*Primary Examiner* — Lam T Mai
(74) *Attorney, Agent, or Firm* — Rimon P.C.

(57) ABSTRACT

An integrating Analog-to-digital converter has a global counter that outputs a counter code signal including a multiphase signal. It also has a column circuit including: a ramp wave generation circuit outputting a ramp wave voltage; a comparator comparing the ramp wave voltage with a pixel voltage; and a latch circuit latching the counter code signal at output inversion timing of the comparator. An output value of the latch circuit is used as a digital conversion output value per the column circuit. The counter has a phase division circuit outputting, as an LSB of the digital conversion output value of the integrating analog-to-digital converter, a phase division signal to the latch circuit, the phase division signal dividing a phase of the counter code signal. The phase division circuit is arranged to a plurality of column circuits, and the LSB is shared by a plurality of phase division circuits.

9 Claims, 15 Drawing Sheets

(56) References Cited

U.S. PATENT DOCUMENTS

| | | | | |
|---|---|---|---|---|
| 2006/0098823 A1* | 5/2006 | Venes | ............... | H04N 7/17309 |
| | | | | 380/219 |
| 2009/0146708 A1* | 6/2009 | Yun | ............... | H03L 7/07 |
| | | | | 327/158 |
| 2009/0323768 A1* | 12/2009 | Chan | ............... | H04B 15/04 |
| | | | | 375/130 |
| 2011/0115663 A1* | 5/2011 | Bogaerts | ............... | H03M 1/123 |
| | | | | 341/164 |
| 2014/0367551 A1* | 12/2014 | Hwang | ............... | H03K 21/026 |
| | | | | 377/107 |
| 2015/0181145 A1* | 6/2015 | Lee | ............... | H04N 25/745 |
| | | | | 341/158 |
| 2019/0058058 A1* | 2/2019 | Liu | ............... | H01L 27/1461 |
| 2020/0195871 A1* | 6/2020 | Iizuka | ............... | H03M 1/145 |
| 2021/0160450 A1* | 5/2021 | Han | ............... | H03K 23/005 |

* cited by examiner

INTEGRATING ANALOG-TO-DIGITAL CONVERTER AND SEMICONDUCTOR DEVICE

CROSS-REFERENCE TO RELATED APPLICATION

The present application claims priority from Japanese Patent Application No. 2021-154059 filed on Sep. 22, 2021, the content of which is hereby incorporated by reference into this application.

BACKGROUND

The present invention relates to an integrating analog-to-digital converter and a semiconductor device, and to a technique effectively applied to, for example, a configuration for locally generating a signal faster than a multiphase counter code signal from the globally transmitted multiphase counter code signal.

A counter code signal of a global counter type analog-to-digital converter in an image sensor in Patent Document 1 (Japanese patent application laid-open No. 2008-92091) is generated in a global counter and is distributed to latch portions lined up in several thousand columns. The analog-to-digital converter of each column latches the counter code signal at the timing when a comparison result signal of an input analog signal and a RAMP wave is inverted, and converts an analog signal into a digital signal. Since a counter is counted for each cycle of a global counter clock, a cycle of the global counter clock corresponds to a time of a signal of 1 LSB of the analog-to-digital converter.

Regarding the counter code signal of Patent Document 1, a reduction in a frequency of the counter code signal is achieved by combining the counter code signal with an upper bit as a gray code and a lower code as a Johnson counter code. For example, a frequency of a counter code signal of a 1-GHz analog-to-digital converter is 125 MHz. As a result, the analog-to-digital converter has been devised so as to enable long-distance and high-load transmission. However, since the Johnson counter code is used, the number of signals is increased by one and the 14 counter code signals represent $2^{13}=8192$ different numbers, so that the analog-to-digital converter leads to becoming a 13-bit analog-to-digital converter.

SUMMARY

Despite the devisal of a circuit as described above, functionality of electronic devices using image sensors and the like has advanced, and required specifications for the analog-to-digital converter mounted on a sensor chip, which is the most important element, have also become more sophisticated. For example, in order to realize speed-up of a frame rate and multiple samplings for reducing noise, the frequency of the counter code signal is required to be speeded up.

Meanwhile, in order to increase the number of pixels, a transmission distance of the counter code signal demands to be extended. Further, in order to increase the number of gradations and improve image quality, the number of bits of the counter-code signal demands to be increased. Furthermore, in order to prevent an image having streaks and an image having unevenness in image quality, the counter code signal demands to have a highly adjusted delay amount. However, if the frequency of the counter code signal is increased in a circuit configuration described above, it is necessary to shorten the transmission distance and reduce the number of conversion bits of the analog-to-digital converter, which causes a problem in that such necessity cannot be compatible with the required specifications.

The present invention has been made in view of the above, and one of purposes thereof is to provide a semiconductor device capable of operating at a speed higher than a frequency of a counter code signal by appropriately combining counter code signals and locally installing phase division circuits in a column at an appropriate interval, the phase division circuit generating a high-speed signal. Other problems and novel features will become apparent from the description of the present specification and the accompanying drawings.

A brief description of the typical invention disclosed in the present application is as follows. The typical integrating analog-to-digital converters includes:

a global counter outputting a counter code signal including a multiphase signal;

a column circuit having:

a ramp wave generation circuit outputting a ramp wave voltage whose voltage value changes linearly according to time change;

a comparator that compares the ramp wave voltage with a pixel voltage generated by a pixel; and a latch circuit latching the counter code signal at timing at which an output of the comparator is inverted;

an output value of the latch circuit being converted into a digital conversion output value per the column circuit; and a phase division circuit inputting the counter code signal, generating a phase division signal that divides a phase of the counter code signal, and outputting the phase division signal to the latch circuit as an LSB of the digital conversion output value of the integrating analog-to-digital converter, in which the global counter is shared to a predetermined number of the column circuit, and in which the phase division circuit is arranged for a plurality of column circuits composed of the column circuit, the number of column circuits being a number smaller than the predetermined number, and the LSB is shared by a plurality of phase division circuits composed of the phase division circuit.

According to one embodiment, by appropriately combining the counter coded signals and locally installing the phase division circuits in the column at the appropriate intervals, the phase division circuit generating the high-speed signal, the semiconductor device is capable of operating at the speed higher than the frequency of the counter code signal.

BRIEF DESCRIPTION OF THE DRAWINGS

FIG. 12 is a timing chart showing an example of an output bit pattern of an analog-to-digital converter according to the second embodiment.

FIG. 15 is a timing chart showing a comparative example and a comparative example of the output bit pattern of the analog-to-digital converter of the present embodiment.

DETAILED DESCRIPTION

Figure 1:
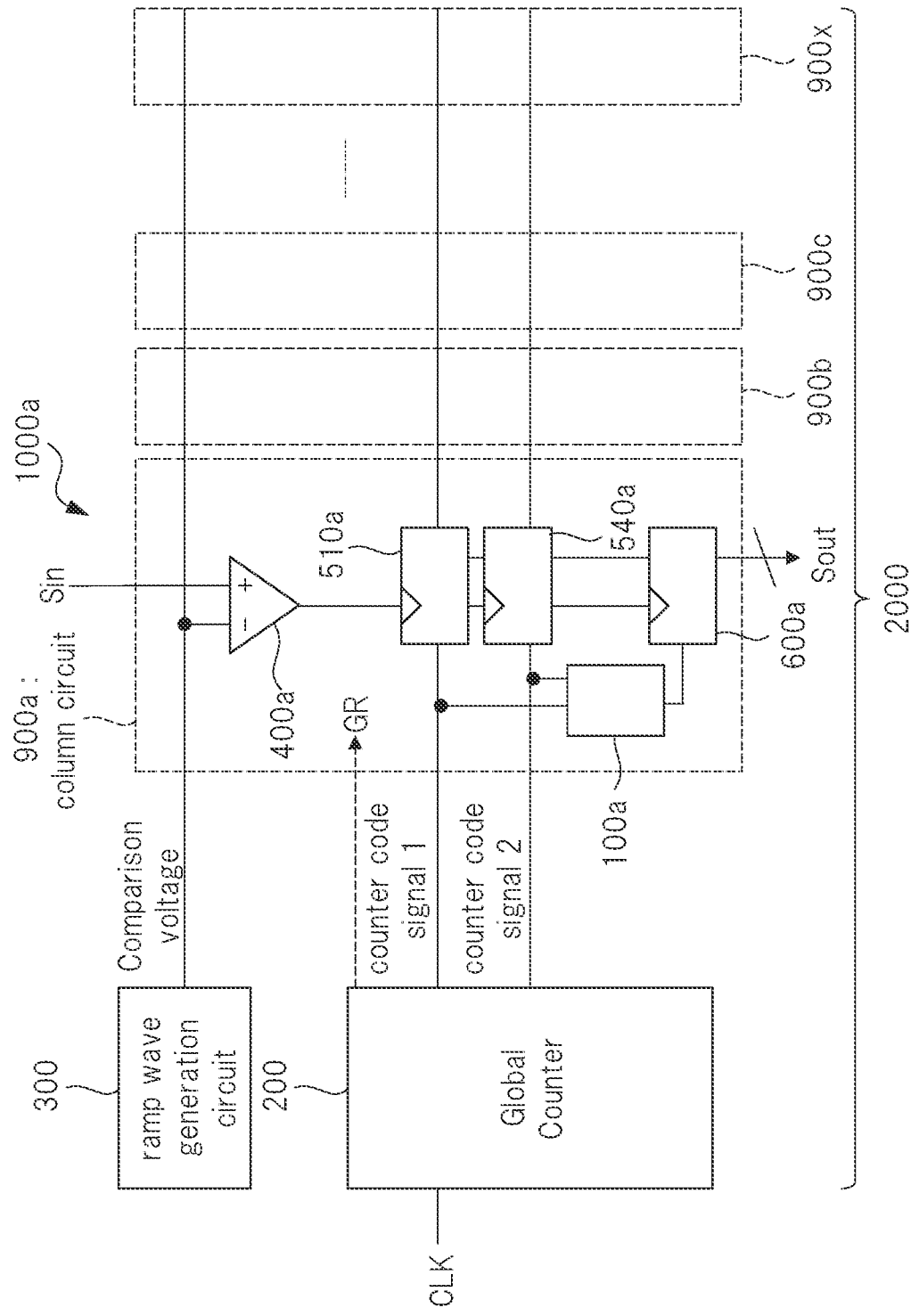
FIG. 1 is a block diagram for explaining an outline of an operation of an analog-to-digital converter according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Further, the circuit element constituting each functional block of the embodiments is not particularly limited, but is formed on a semiconductor substrate such as monocrystalline silicon by a known integrated circuit technique such as a CMOS (complementary MOS transistor).

Hereinafter, embodiments of the present disclosure will be described in detail with reference to the drawings. In addition, in all the drawings for explaining the embodiment, the same members are designated by the same reference numerals in principle, and the repeated description thereof will be omitted.

Furthermore, the dimensional ratios in the drawings are exaggerated for convenience of explanation and may differ from the actual ratios.

First Embodiment

FIG. 1 is a block diagram illustrating an outline of an operation of an analog-to-digital converter according to a first embodiment. An integrating analog-to-digital converter 1000a includes a global counter 200, a ramp wave generation circuit 300, a comparator 400a, a latch circuit 510a, a latch circuit 540a, a latch circuit 600a, and a phase division circuit 100a. Incidentally, the latch circuit 600a is a latch circuit for LSB. Further, the latch circuit 510a and the latch circuit 540a are latch circuits for middle-order bit on the LSB. Although not shown, the latch circuit for high-order bit outputs a gray code signal GR from the global counter 200 as a signal for high-order bit.

A pixel output voltage level of a pixel of an imaging element such as an image sensor (not shown) is inputted as an electric signal Sin to a non-inverting input of the comparator 400a. A comparison voltage outputted from the ramp wave generation circuit 300 is inputted to an inverting input of the comparator 400a. At latch timing when the pixel output voltage level of the imaging element and the comparison voltage match with each other, an output level of the comparator 400a rises and a counter code signal inputted to the latch circuit is latched and is outputted in parallel as an output signal Sout. The latched counter code signal is a logical level at latch timing of counter code signals such as a counter code signal 1 and a counter code signal 2 shown in FIG. 1. The logic level indicates a logic level of each bit value of a digital output value of the integrating analog-to-digital converter 1000a.

The comparative voltage outputted from the ramp wave generation circuit 300 is preferably a voltage that increases linearly with time. Further, a noise level of the comparison voltage is preferably smaller than a determination level of an LSB signal of the integrating analog-to-digital converter 1000a.

It is preferable that a high-order bit of the global counter 200 outputs a gray code, a middle-order bit outputs a Johnson counter code, and an LSB signal is a local multiplication signal generated from the Johnson counter code. For example, when the counter code signal 1 shown in FIG. 1 is a Johnson counter code and the counter code signal 2 is also a Johnson counter code, the LSB signal is a local multiplication signal generated from the Johnson counter code. In addition, a gray code (not shown) is outputted as a high-order bit. Incidentally, details of the phase division circuit 100a will be described later. Further, the local multiplication signal means a phase division signal outputted from the phase division circuit, as will be described later.

The latch circuit 510a that latches the middle-order and high-order bits has a function of latching the counter code signal 1 corresponding to the middle-order and high-order bits of the integrating analog-to-digital converter 1000a outputted from the global counter 200 at the timing when the input levels of the comparator 400a become equal. For example, the counter code signal 1 is a Johnson counter code signal. The latch circuit 510a outputs the logic level of the latched counter code signal 1 as a logic level of the middle-order and high-order bits of the integrating analog-to-digital converter 1000a.

The latch circuit 520a that latches the middle-order and low-order bits has a function of latching the counter code signal 2 corresponding to the middle-order and low-order bits of the integrating analog-to-digital converter 1000a outputted from the global counter 200 at the timing when the input levels of the comparator 400a become equal. For example, the counter code signal 2 is also a Johnson counter code signal. The latch circuit 520a outputs the logic level of the latched counter code signal 2 as a logic level of the middle-order and low-order bits of the integrating analog-to-digital converter 1000a.

The phase division circuit 100a outputs a high-speed phase division signal that changes in an intermediate phase between the counter code signal 1 and the counter code signal 2 outputted from the global counter 200. Further, by using combination of the counter code signal 1 and the counter code signal 2 as a multiphase clock signal of a relatively low-speed signal by the Johnson counter code signal, the counter code signal 1 and the counter code signal 2 can be signals capable of withstanding relatively long-distance and high-load transmission. Further, the phase division circuit 100a is arranged adjacent to the circuit that requires a high-speed operation, thereby making it possible to supply a signal at high speed and low delay.

Since the counter code signal 1 and the counter code signal 2 are relatively low-speed multiphase clock signals, they are signals capable of withstanding the relatively long-distance and high-load transmission. However, since the phase division signal is a high frequency signal as compared with the counter code signal 1 and the counter code signal 2, it is preferably transmitted in a short-distance range. For example, when the phase division signal is in a gigahertz band, it is desirable that the phase division circuit 100a is arranged from the global counter 200 per 1 to several hundred column circuits, preferably per several ten to several hundred column circuits.

The latch circuit 600a that latches the LSB signal has a function of latching the phase division signal outputted from the phase division circuit 100a at the timing when the input level of the comparator 400a becomes equal. The latch circuit 600a outputs the logic level of the latched phase division signal as a logic level of the LSB signal of the integrating analog-to-digital converter 1000a.

According to such a circuit example, the phase division circuit, which generates a signal faster than the global counter code signal that determines the operating frequency of the semiconductor device, is arranged in the column. Therefore, the semiconductor device can operate at a higher speed than the global counter code signal. Further, since the input of the phase division circuit can use a plurality of relatively low-speed Johnson counter code signals, it can withstand long-distance transmission and high-load transmission. Furthermore, since the phase division signal of the phase division circuit outputs a high-speed signal changing in an intermediate phase of the Johnson counter code signal which is a multiphase clock, probability of erroneous counting can be reduced. Moreover, since the phase division circuit can be designed to be arranged adjacent to a circuit requiring a high-speed operation as needed, the phase division signal can be supplied over a short distance and with a low load.

Specific Configuration of Analog-to-Digital Converter in Semiconductor Device

Figure 2:
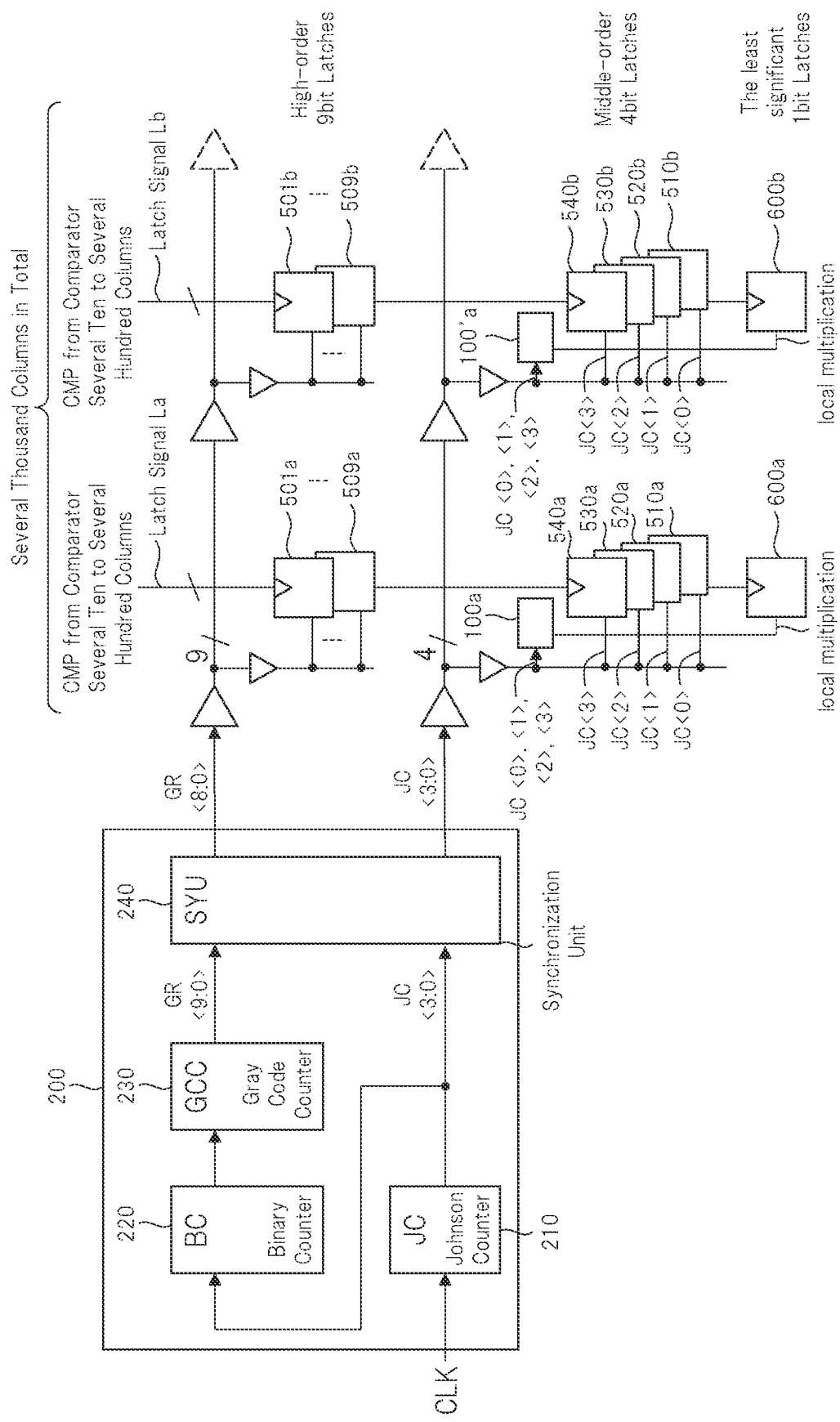
FIG. 2 is a block diagram for explaining a part of a specific configuration of the analog-to-digital converter according to the first embodiment.

FIG. 2 is a block diagram showing a part of a specific configuration of the analog-to-digital converter according to the first embodiment. That is, FIG. 2 is an example of a configuration in which the high-order bit of the global counter 200 outputs a 9-bit gray code signal, the middle-order bit outputs a 4-bit Johnson counter code signal, and the LSB signal of the analog-to-digital converter is generated from the 4-bit Johnson counter code signal.

A clock signal CLK with a fixed cycle is inputted to the input of the global counter 200. A frequency of the clock signal CLK may be any frequency, but it is not prevented from having a gigahertz band. The clock signal CLK is converted into a Johnson counter code signal by a Johnson counter 210. As an example, when the clock signal CLK is 810 MHz, the Johnson counter code signal can also be set to 202.5 MHz.

The global counter 200 includes a Johnson counter 210, a binary counter 220, a Gray code counter 230, and a synchronization unit 240.

The Johnson counter 210 inputs the clock signal CLK and generates a four-phase Johnson counter code signal, for example, a Johnson counter code signal <0> to a Johnson counter code signal <3>. The Johnson counter code signal <0> and the Johnson counter code signal <1> are shifted by a phase of two clock signals CLK, and the Johnson counter code signal <1> and the Johnson counter code signal <2> are shifted by a phase of the two clock signals CLK. Further, the Johnson counter code signal <0> and the Johnson counter code signal <2> are shifted by a phase of the 4 clock signals CLK. Details thereof will be described with reference to FIG. 6.

The binary counter 220 generates a binary code signal by inputting a Johnson counter code signal, for example, the Johnson counter code signal <3>, corresponding to a fourth bit of the analog-to-digital converter outputted from the Johnson counter 210. A signal corresponding to the LSB signal of the analog-to-digital converter is generated in the phase division circuit 100a described later.

The gray code counter 230 inputs a binary code signal outputted from the binary counter 220, and generates a ninth-phase gray code signal, for example, a gray code signal <0> to a gray code signal <8>. For example, the gray code signal <8> corresponds to a MSB signal of the analog-to-digital converter.

The synchronization unit 240 is such a synchronization circuit as to synchronize the clock signal CLK inputted to the global counter 200 and output the gray code signal <0> to the gray code signal <8> and the Johnson counter code signal <0> to the Johnson counter code signal <3>. The presence of the synchronization unit 240 makes it possible for an output value of the analog-to-digital converter to be accurately outputted in synchronization with the clock signal CLK.

The gray code signals <0> to <8> are inputted to the latch circuits 501a to 509a, respectively. That is, each of the latch circuit 501a to the latch circuit 509a inputs each of the gray code signal <0> to the gray code signal <8>. Then, when the latch signal La rises, the latch circuit latches each logic level of the gray code signal <0> to the gray code signal <8>. The latched logic level corresponds to a logic level of high-order 9 bits of the analog-to-digital converter and becomes an output of the analog-to-digital converter. Further, the latch signal La is a comparison result signal CMP which is an output signal of the comparator 400a of FIG. 1, and FIG. 2 shows that the comparison result signal CMP which is the latch signal La is transmitted from the comparator (comparator 400a of FIG. 1).

The Johnson counter code signal <0> is inputted to the latch circuit 510a, the Johnson counter code signal <1> is inputted to the latch circuit 520a, and the Johnson counter code signal <2> is inputted to the latch circuit 530a. Further, the Johnson counter code signal <3> is inputted to the latch circuit 540a. The phases of the Johnson counter code signal <0> to the Johnson counter code signal <3> are different by the two clock signals CLK in ascending or descending order. When the latch signal La rises, the latch circuit 510a to the latch circuit 540a latch the respective logic levels of the Johnson counter code signal <0> to the Johnson counter code signal <3>. The latched logic level corresponds to the middle-order 4-bit logic level directly above the LSB of the analog-to-digital converter and becomes the output of the analog-to-digital converter. Furthermore, as described above, the latch signal La is also inputted to the latch circuit 510a. The latch signal La is a comparison result signal CMP which is an output signal of the comparator 400a of FIG. 1, and FIG. 2 shows that the comparison result signal CMP which is the latch signal La is transmitted from the comparator (comparator 400a of FIG. 1).

The phase division circuit 100a inputs the Johnson counter code signal <0> from the Johnson counter code signal <3>, and generates a phase division signal whose phase changes at an intermediate position where the phase of the adjacent Johnson counter code signal changes. For example, the phase of the phase division signal changes at an approximately intermediate position of a phase variation position between the phase change positions of the Johnson counter code signal <0> and the Johnson counter code signal <1>, and changes at an approximately intermediate position of a phase variation position between the Johnson counter code signal <1> and the Johnson counter code signal <2>. Further, the phase of the phase division signal changes at an approximately intermediate position of a phase variation position between the Johnson counter code signal <2> and the Johnson counter code signal <3>, and changes at an approximately intermediate position of a phase variation position between the Johnson counter code signal <3> and the Johnson counter code signal <0>. Incidentally, given as examples of the phase division circuit 100a are a SMD (Synchronous Miller Delivery) and a PI (Pase Interpolator), etc.

The phase division signal is inputted to the latch circuit 600a, and when the latch signal La rises, the logic level of the phase division signal is latched. The latched logic level corresponds to the logic level of the LSB of the analog-to-digital converter and becomes an output of the analog-to-digital converter. Further, as described above, the latch signal La is also inputted to the latch circuit 600a. The latch signal La is a comparison result signal CMP which is an output signal of the comparator 400a of FIG. 1, and FIG. 2 shows that the comparison result signal CMP which is the latch signal La is transmitted from the comparator (comparator 400a of FIG. 1).

As described above or below, by arranging the phase division circuit of the LSB every one or several ten to several hundred columns, the phase division signal which is the LSB signal can be transmitted over a short distance with a low load and with low delay.

Further, as is clear from FIG. 2, a counter code signal that is not inputted to the phase division circuit 100a and corresponds to an output value of the latch circuit is a gray code signal, the output value of the latch circuit becoming a high-order bit of a digital conversion output value of the integrating analog-to-digital converter.

Figure 3:
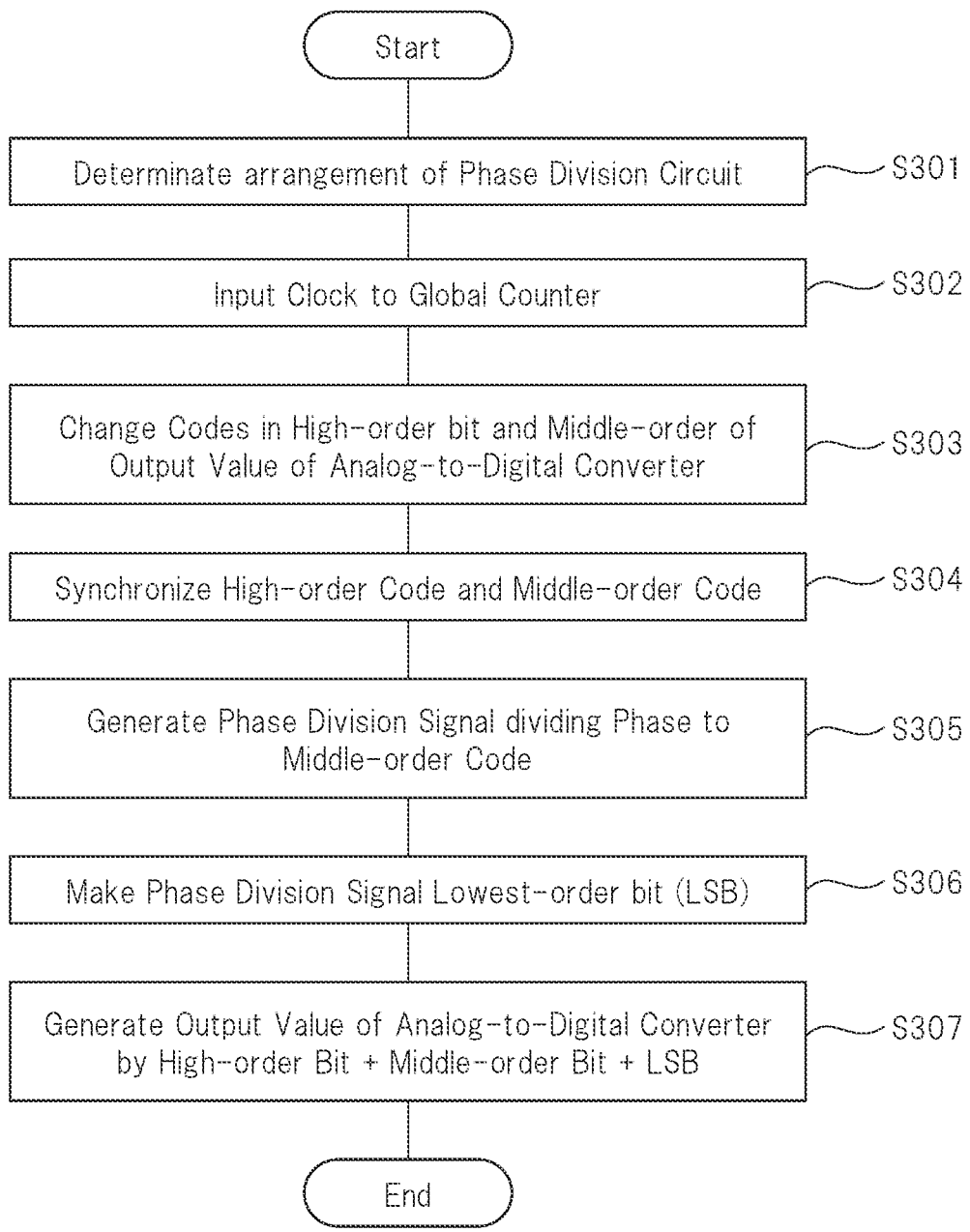
FIG. 3 is a flowchart showing an example of the operation of the analog-to-digital converter according to the first embodiment.

Example of Operation Flow of Analog-to-Digital Converter of Semiconductor Device FIG. 3 is a flowchart showing an example of an operation of the analog-to-digital converter according to the first embodiment. Incidentally, an outline of the operation of FIG. 3 is a summary of the contents described in FIGS. 1 and 2.

In step S301, arrangement of a phase division circuit is determined. The phase division circuit generates an LSB signal of an analog-to-digital converter that analog-to-digital converts a voltage generated in a pixel formed by a photodiode of a semiconductor device. The pixel may be, for example, a part of an imaging element formed in the semiconductor device. It is desirable that the phase division circuit is arranged in the vicinity of a circuit portion in the analog-to-digital converter, the circuit portion requiring a high-speed operation. Further, the phase division circuits do not need to be arranged one-to-one with respect to the analog-to-digital converters of all the columns, and arrangement of one phase division circuit at intervals of several ten to several hundred columns or more makes it possible to obtain an effect(s) of the present embodiment.

In step S302, the analog-to-digital converter inputs the clock signal CLK to the global counter. Incidentally, since the counter code signal outputted from the global counter is a signal to be counted up, a count value proportional to time when the values of the signals inputted to the comparator become the same is an output value of the integrating analog-to-digital converter in the present embodiment.

In step S303, the analog-to-digital converter uses a code having few change bits when the high-order bit of the output value of the analog-to-digital converter changes to an adjacent value such as a Gray code. For example, the Gray code has a characteristic in which only one bit changes at all times in changing from a certain value to a value adjacent thereto and a Hamming distance between adjacent codes located before and after is always 1. Therefore, even if variations occur between the gray code bits due to occurrence of an influence such as wiring delay, the gray code shifts only about one code, so that the influence on the high-order bits can be reduced. Meanwhile, the analog-to-digital converter changes a code at a lower speed so that power consumption becomes low for a middle-order bit of a high frequency, and uses a Johnson counter code etc. that can be realized by a simple circuit configuration such as flip flop. Incidentally, in the above case, the low-order bit obtained by excluding the high-order bit and the middle-order bit from the output bit of the analog-to-digital converter indicates the LSB.

In step S304, the global counter synchronizes the counter code signal of the high-order bit and the counter code signal of the middle-order bit, which are different counter code signals. For example, the gray code signal of the high-order bit and the Johnson counter code signal of the middle bit are outputted in synchronization with the clock signal CLK inputted to the global counter 200. The Johnson counter code signal of the middle-order bit is a Johnson counter code signal from the Johnson counter code signal <0> to the Johnson counter code signal <3>. The Johnson counter code signal from the Johnson counter code signal <0> to the Johnson counter code signal <3> has a duty ratio of ½, and their phases are shifted by the two clock signals CLK.

In step S305, the phase division circuit 100a inputs the Johnson counter code signal <3> from the Johnson counter code signal <0>, and generates the phase division signal whose phase changes at an intermediate position where the phase of the adjacent Johnson counter code signal changes. That is, the phase division signal is a signal having a frequency of twice the frequency represented by the 4-bit Johnson counter code signal.

In step S306, the analog-to-digital converter sets the phase division signal, which is a signal having the highest frequency, as the LSB of the analog-to-digital converter. Since the phase division signal outputs a high-speed signal changing in an intermediate phase of the Johnson counter code signal which is a multiphase clock, the probability of erroneous counting can be reduced. Further, since the phase division circuit can be designed to be arranged adjacent to a circuit requiring a high-speed operation as needed, the phase division signal can be supplied over a short distance and with a low load.

In step S307, the analog-to-digital converter outputs, as the output of the analog-to-digital converter, the LSB due to the high-order bit by the gray code or the like, the middle-order bit by the Johnson counter code or the like, and the phase divided signal by the phase division circuit 100a. According to such an operation, the execution speed of the analog-to-digital converter can be made twice or more than the conventional execution speed without increasing the frequency of the clock signal CLK inputted to the global counter 200. Further, the execution speed of the analog-to-digital converter can be made twice or more than the conventional execution speed without increasing the frequency of the counter code signal transmitted over a long distance and outputted from the global counter 200.

That is, the analog-to-digital converter according to the present embodiment can respond to user demands such as improvement of a frame rate of an imaging element (not shown) connected to the input of the analog-to-digital converter, an increase in the number of pixels, and improvement in image quality. Further, the analog-to-digital converter can be speeded up without increasing a chip area of the analog-to-digital converter and assembly cost.

Example of Phase Division Circuit 100a According to First Embodiment

Figure 4:
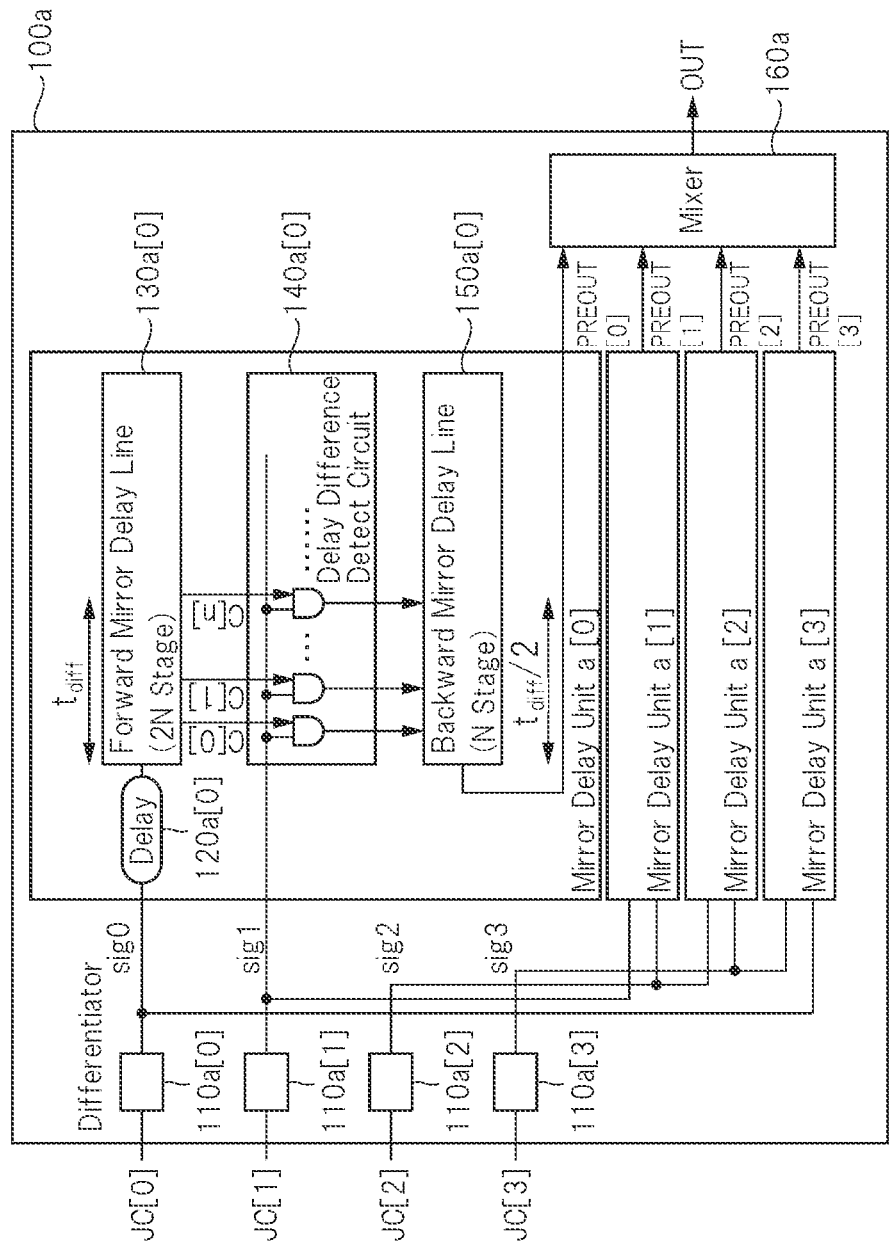
FIG. 4 is a block diagram showing an example of a phase division circuit according to the first embodiment.

FIG. 4 is a block diagram showing an example of the phase division circuit according to the first embodiment. The phase division circuit 100a according to the first embodiment functions as an SMD circuit that has four Johnson counter code signals <0> to <3> with different phases as inputs. The phase division circuit 100a includes: a differentiator 110a[0] generating pulses at rising and falling of the Johnson counter code signal <0>; and a differentiator 110a[1] generating pulses at rising and falling of the Johnson counter code signal <1>. Further, the phase division circuit 100a includes: a differentiator 110a[2] generating pulses at rising and falling of the Johnson counter code signal <2>; and a differentiator 110a[3] generating pulses at rising and falling of the Johnson counter code signal <3>. A pulse signal of the Johnson counter code signal <0> is sig0, a pulse signal of the Johnson counter code signal <1> is sig1, a pulse signal of the Johnson counter code signal <2> is sig2, and a pulse signal of the Johnson counter code signal <3> is sig3.

The pulse signal sig0 and the pulse signal sig1 are inputted to a mirror delay unit a[0], and the mirror delay unit a[0] generates a preout signal [0] that rises in an intermediate phase between the pulse signal sig1 and the pulse signal sig2. That is, the mirror delay unit a[0] outputs a preout signal [0] delayed from the rise of the pulse signal sig1 by a phase difference ($t_{diff}/2$) that is half a phase difference ($t_{diff}$) between the pulse signal sig0 and the pulse signal sig1.

Further, the mirror delay unit a[1] inputs the pulse signal sig1 and the pulse signal sig2, and generates a preout signal [1] that rises in an intermediate phase between the pulse signal sig2 and the pulse signal sig3. That is, the mirror delay unit a[1] outputs a preout signal [1] delayed from the rise of the pulse signal sig2 by half a phase difference ($t_{diff}/2$) that is half a phase difference ($t_{diff}$) between the pulse signal sig1 and the pulse signal sig2. Incidentally, since an internal circuit of the mirror delay unit a[1] is the same as that of the mirror delay unit a[0], detailed drawings thereof will be omitted.

In addition, the mirror delay unit a[2] inputs the pulse signal sig2 and the pulse signal sig3, and generates a preout signal [2] that rises in an intermediate phase between the pulse signal sig3 and the pulse signal sig0. That is, the mirror delay unit a[2] outputs a preout signal [2] delayed from the rise of the pulse signal sig3 by a phase difference ($t_{diff}/2$) that is half a phase difference ($t_{diff}$) between the pulse signal sig2 and the pulse signal sig3. Incidentally, since an internal circuit of the mirror delay unit a[1] is the same as that of the mirror delay unit a[0], detailed drawings thereof will be omitted.

Furthermore, the mirror delay unit a[3] inputs the pulse signal sig3 and the pulse signal sig0, and generates a preout signal [3] that rises in an intermediate phase between the pulse signal sig0 and the pulse signal sig1. That is, the mirror delay unit a[3] outputs a preout signal [3] delayed from the falling of the pulse signal sig0 by a phase difference ($t_{diff}/2$) that is half a phase difference ($t_{diff}$) between the pulse signal sig3 and the pulse signal sig0. Incidentally, since an internal circuit of the mirror delay unit a[3] is the same as that of the mirror delay unit a [0], detailed drawings thereof will be omitted.

Example of Mirror Delay Unit

The mirror delay unit a[0] shown in FIG. 4 has a forward mirror delay line 130a[0] that generates a delay time of 2×clock signal CLK=$t_{diff}$ between a delay signal C[0] and a delay signal C[n]. Further, the mirror delay unit a[0] includes a backward mirror delay line 150a[0] that generates a delay time of clock signal CLK=($t_{diff}/2$). Furthermore, the mirror delay unit a[0] includes a delay difference detection circuit 140a [0] that detects synchronization with a delay signal C[n] of a Johnson counter code signal <n−1> (n: natural number) inputted to the forward mirror delay line 130a[0] and a Johnson counter code signal <n> subsequent and adjacent thereto. In addition, the mirror delay unit a[0] includes a delay circuit 120a[0] for adjusting timing of the delay signal C[n] inputted to the delay difference detection circuit 140a[0].

A pulse signal sig0 generated at the rising and falling of the Johnson counter code signal [0] inputted to the mirror delay unit a[0] is outputted as the delay signal C[n] delayed by $t_{diff}$ while the forward mirror delay line 130a[0] is transmitted. A pulse signal sig1 inputted to the delay difference detection circuit 140a[0] is delayed by $t_{diff}$ from the pulse signal sig0. Therefore, by the pulse signal sig1 and the delay signal C[n] inputted to the delay difference detection circuit 140a[0], a new pulse signal is formed, and a preout signal [0] delayed by ($t_{diff}/2$) at the backward mirror delay line 150a [0] is generated.

Example of Mixer

A mixer 160a inputs a preout signal [0], a preout signal [1], a preout signal [2], and a preout signal [3], and outputs a phase division signal OUT whose phase is inverted at an intermediate point between phases of adjacent preout signals. Therefore, the mixer 160a inverts a signal level at the rising of the preout signal [0], maintains the inverted signal level, returns the inverted signal level to an original signal level at the rising of the preout signal [1], and maintains the original signal level. Further, the mixer 160a inverts a signal level at the rising of the preout signal [2], maintains the inverted signal level, returns the inverted signal level to an original signal level at the rising of the preout signal [3], and maintains the original signal level. The mixer 160a repeats the above operations and outputs the repeated signal level as the phase division signal OUT.

Example of Timing Chart of Phase Division Circuit According to First Embodiment

Figure 5:
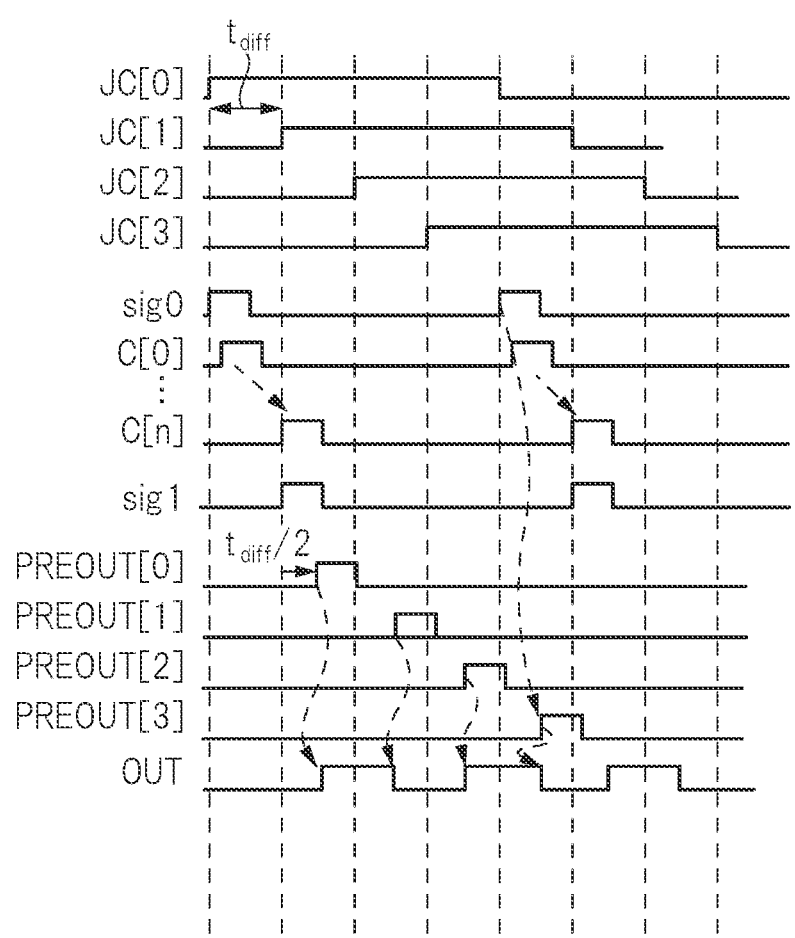
FIG. 5 is a timing chart of an example of the phase division circuit related to FIG. 4.

FIG. 5 is a timing chart of an example of the phase division circuit related to FIG. 4. The Johnson counter code signal [0], the Johnson counter code signal [1], the Johnson counter code signal [2], and the Johnson counter code signal [3] have phases shifted from one another by $t_{diff}$. Further, one Johnson counter code signal is also a pulse signal having a half cycle of 4 $t_{diff}$. The pulse signal sig0 is a pulse signal having a high-level period of about ($t_{diff}/2$) that starts from the rising and falling of the Johnson counter code signal [0]. Further, the pulse signal sig1 is a pulse signal having a high-level period of about ($t_{diff}/2$) that starts from the rising and falling of the Johnson counter code signal [1]. The delay signal C[n] is a pulse signal which is a signal of the rising or falling of the Johnson counter code signal [0], that is, a signal delayed by $t_{diff}$ from the rising of the pulse signal sig0 and which has a high-level period having about ($t_{diff}/2$) and started from the rising. Therefore, the pulse signal sig1 and the delay signal C[n] are AND-connected as shown in FIG. 4, and generate a preout signal PREOUT[0] delayed by ($t_{diff}/2$) from the Johnson counter code signal [1] at the backward mirror delay line 150a[0].

Although omitted in FIG. 5, the delay signal C[(n] of the pulse signal sig2 and the pulse signal sig1 is AND-connected. Then, the AND-connected signal generates a preout signal PREOUT [1] delayed by ($t_{diff}/2$) from the Johnson counter code signal [2] at a backward mirror delay line 150a[1]. Similarly, although omitted in FIG. 5, the delay signal C[n] of the pulse signal sig3 and the pulse signal sig2 is AND-connected. Then, the AND-connected signal generates a preout signal PREOUT [2] delayed by ($t_{diff}/2$) from the Johnson counter code signal [3] at a backward mirror delay line 150a[2]. Similarly, although omitted in FIG. 5, the delay signal C[n] of the pulse signal sig0 and the pulse signal sig3 is AND-connected. Then, the AND-connected signal generates a preout signal PREOUT [3] delayed by ($t_{diff}/2$) from the falling of the Johnson counter code signal [0] at a backward mirror delay line 150a[3].

The phase division signal OUT in FIG. 5 has an initial state of "0", but transitions to a high level at the rising of the preout signal PREOUT[0], then maintains the high level, transitions to a low level at the rising of the preout signal PREOUT[1], and then maintains the low level. Thereafter, it transitions to a high level at the rising of the preout signal PREOUT[2], then maintains the high level, transitions to a low level at the rising of the preout signal PREOUT[3], and then maintains the low level. Subsequently, the phase division signal OUT repeats the above operation. That is, the phase division signal of the phase division circuit outputs a high-speed signal changing in an intermediate phase of the Johnson counter code signal which is a multiphase clock, it can reduce the probability of erroneous counting. Furthermore, since the phase division circuit can be designed to be arranged adjacent to the circuit requiring the high-speed operation as needed, it can supply the phase division signal over a short distance and with a low load.

Therefore, it is preferable that the phase division circuit 100a is arranged in a column circuit that operates at a speed higher than that of an operating frequency of an adjacent column circuit. Further, since the column circuit operating at a high speed may be not one column circuit but a plurality of neighboring or adjacent column circuits, the phase division circuit 100a may be arranged within one to several hundred column circuits from the above-mentioned column circuit, preferably within several ten to several hundred column circuits.

Figure 6:
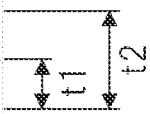
FIG. 6 is a timing chart showing an example of an output bit pattern of the analog-to-digital converter according to the first embodiment.

Example of Pattern of Output Bit of Analog-to-Digital Converter According to First Embodiment FIG. 6 is a timing chart showing an example of an output bit pattern of the analog-to-digital converter according to the first embodiment. That is, FIG. 6 shows below-described output bits of the integrating analog-to-digital converter 1000a according to the first embodiment. That is, the output bits are: the Johnson counter code signal JC<0> to the Johnson counter code signal JC<3>, which outputs the middle-order 4 bits from the LSB; the gray code signal <3>, which is one bit of the high-order bit, and the phase division signal OUT of the LSB signal. The LSB signal may also be referred to as a local multiplication signal. That is, the counter code signal inputted to the phase division circuit 100a is a Johnson counter code signal, and the adjacent Johnson counter code signals have a ⅛ cycle phase difference and a duty of 50%. Four Johnson counter code signals having different ⅛ periodic phases are inputted in parallel to the phase division circuit 100a.

An upper-stage counter value of FIG. 6 indicates the number of clocks of the clock signal CLK inputted to the global counter 200. Therefore, when the counter value is "0", the input of the integrating analog-to-digital converter 1000a is nothing, so that the phase division signal OUT="0" and the Johnson counter code signal JC<0> to the Johnson counter code signal JC<3>="0" and the other bits="0". Each time the counter value is incremented by two, a phase division signal whose phase changes at an intermediate position where the phase of the adjacent Johnson counter code signal changes is generated. That is, the phase division signal becomes a signal having a frequency of twice an edge change of the Johnson counter code signal. Like this, the phase division signal outputs a high-speed signal changing in an intermediate phase of the Johnson counter code signal which is a multiphase clock, so that the probability of erroneous counting can be reduced. Furthermore, since the phase division circuit can be designed to be arranged adjacent to the circuit requiring high-speed operation as needed, the phase division signal can be supplied over a short distance and with a low load.

According to such an operation, the execution speed of the analog-to-digital converter can be made twice or more than the conventional execution speed without increasing the frequency of the clock signal CLK inputted to the global counter 200. Further, the execution speed of the analog-to-digital converter can be made twice or more than the conventional execution speed without increasing the frequency of the counter code signal transmitted over a long distance and outputted from the global counter 200. That is, the analog-to-digital converter according to the present embodiment can respond to user demands such as improvement of a frame rate of an imaging element (not shown) connected to the input of the analog-to-digital converter, an increase in the number of pixels, and improvement in image quality. Furthermore, the analog-to-digital converter can be speeded up without increasing the chip area of the analog-to-digital converter and the assembly cost.

Figure 7:
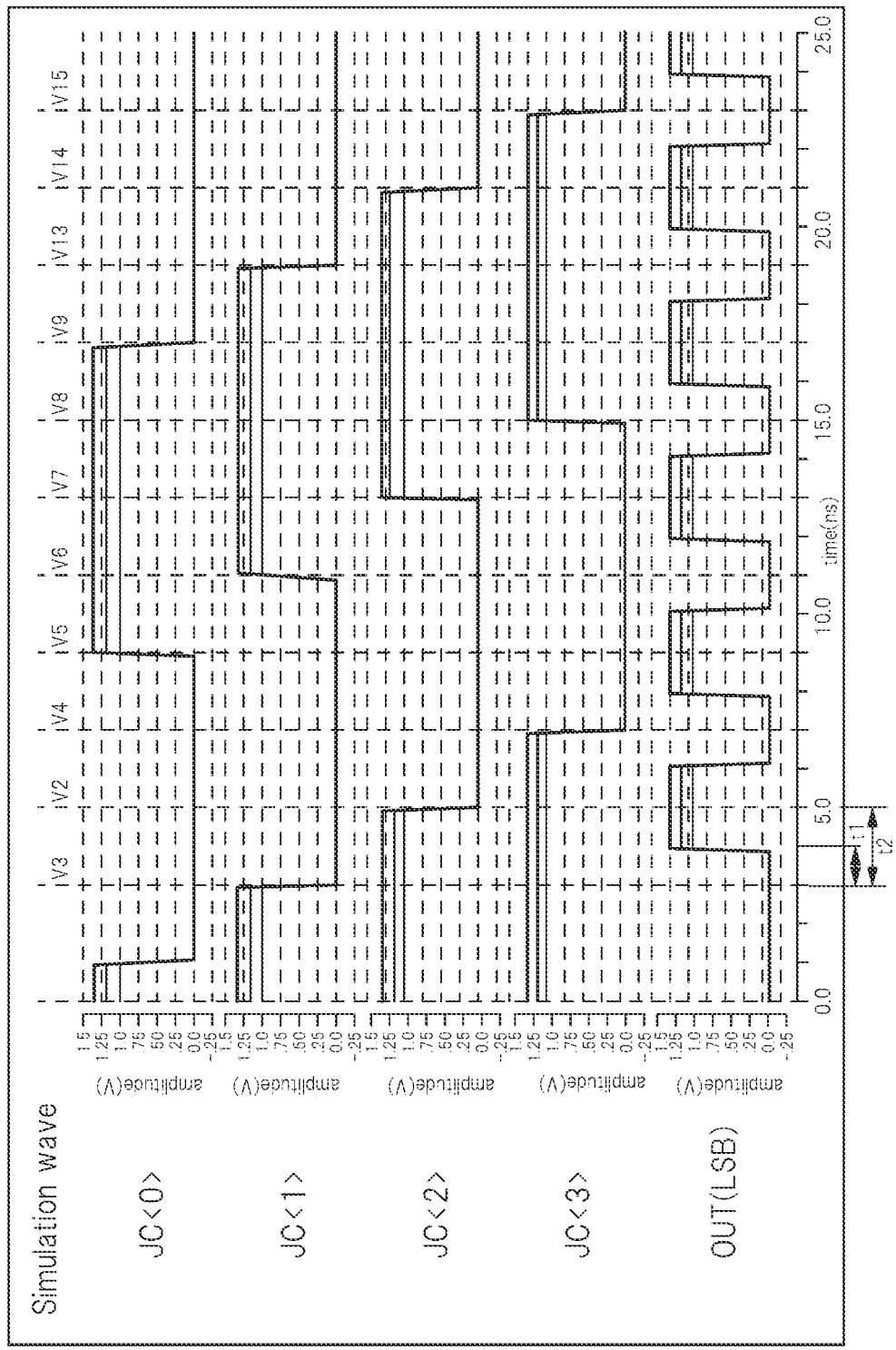
FIG. 7 is a diagram showing an example of a simulation result of a Johnson counter code signal and a phase division signal generated by the phase division circuit according to the first embodiment.

Example of Simulation Result of Johnson Counter Code Signal and Phase Division Circuit FIG. 7 is a diagram showing an example of a simulation result of a Johnson counter code signal according to the first embodiment and a phase division signal generated by a phase division circuit according to the first embodiment. Since the Johnson counter code signal operates at about 125 MHz, a conversion time of the analog-to-digital converter when the phase division signal is not used as the LSB signal operates in $2n$ seconds by using a 4-phase Johnson counter code signal. However, as can be seen from FIG. 7, it can be seen that the phase division signal generated by the phase division circuit can be used as the LSB signal of the analog-to-digital converter. In this case, the conversion time of the analog-to-digital converter is in seconds, and the execution speed of the analog-to-digital converter can make the execution speed so far double.

Another Examples of Phase Division Circuit According to First Embodiment

Figure 8:
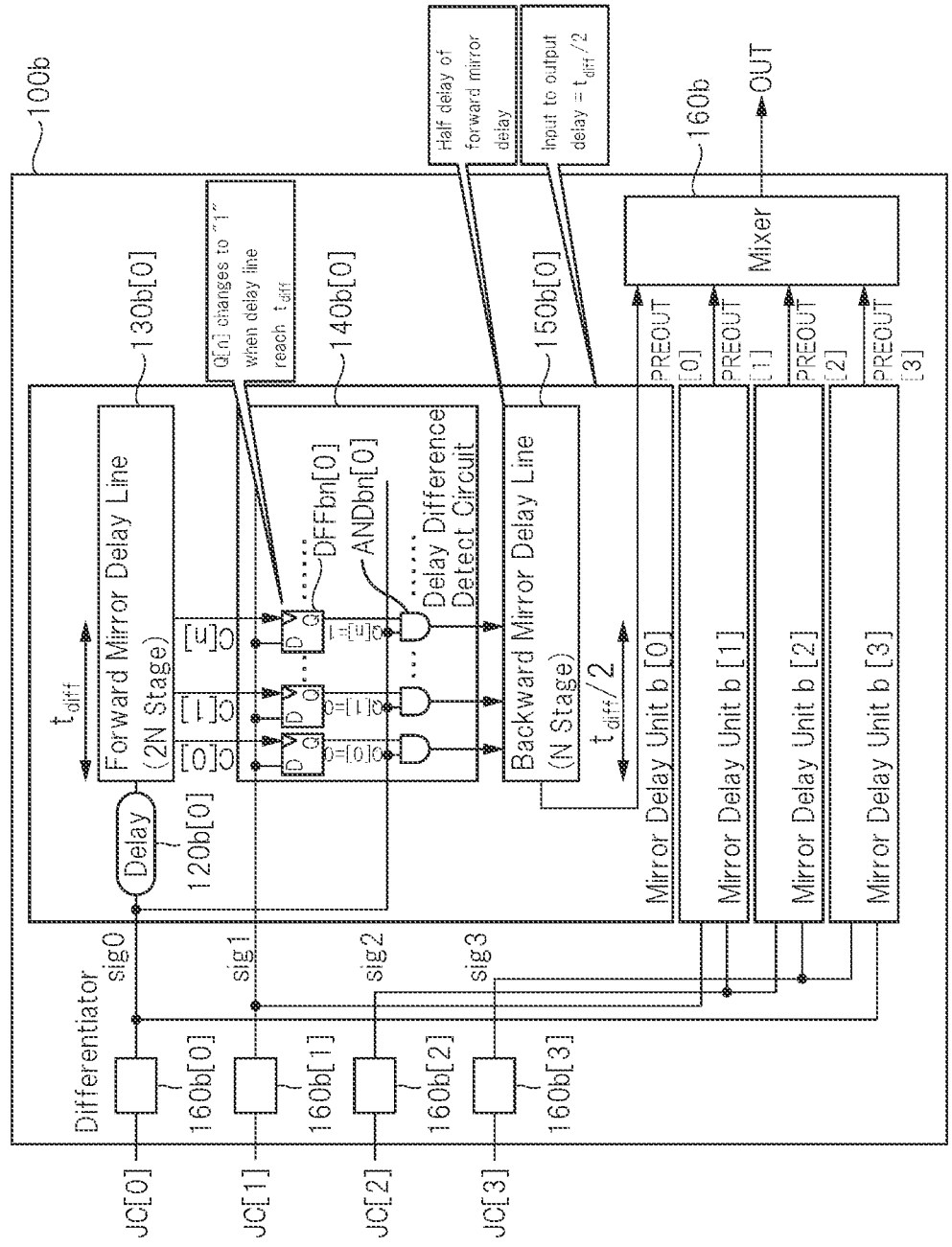
FIG. 8 is a block diagram showing another example of the phase division circuit according to the first embodiment.

FIG. 8 is a block diagram showing another example of the phase division circuit according to the first embodiment. Similar to the phase division circuit 100a, a phase division circuit 100b according to the first embodiment functions as an SMD circuit that inputs four Johnson counter code signals <0> to <3> having different phases. A configuration in which the phase division circuit 100b is different from the phase division circuit 100a is that a D-type flip-flop is included in a delay difference detection circuit 140b[0] or the like and that the preout signal PREOUT is outputted in synchronization with the falling of the Johnson counter code signal.

Since the configurations other than the D-type flip-flop are the same in those of the phase division circuit 100a and the phase division circuit 100b, a description thereof will be omitted in order to avoid duplication of description. First, a mirror delay unit b[0] will be described. A delay signal C[n] of the pulse signal sig0 of the Johnson counter code signal <0> is inputted to a clock terminal of a D-type flip-flop DFFbn[0]. At rising timing of the delay signal C[n] (delay time ($t_{diff}$)+delay time of a delay circuit 120b[0]), the pulse signal sig1 of the data input terminal is in a high state, so that an output terminal signal Q[n] of the D-type flip-flop DFFbn[0] is in a high state. In addition, immediately after the output terminal signal Q[n] is in the high state, a pulse signal sig1 of the Johnson counter code signal <1> is in a low state, so that an output of an AND circuit ANDbn[0] is also in a low state and the phase division signal PREOUT[0] also outputs a low-level signal.

Timing at which the pulse signal sig0 generated at falling timing of the Johnson counter code signal <0> is inputted to the AND circuit ANDbn[0] is also timing at which an output terminal signal Q[n] of the D-type flip-flop DFFbn[0] is in a high state. Therefore, the output of the AND circuit ANDbn[0] is also in the high state, and the phase division signal PREOUT[0] also outputs a high-level signal after being delayed by ($t_{diff}/2$). That is, the mirror delay unit b[0] outputs a preout signal [0] delayed from the rising of the pulse signal sig0 by ($t_{diff}/2$) that is half a phase difference ($t_{diff}$) between the pulse signal sig0 and the pulse signal sig1. The pulse signal sig0 in this case is generated at falling timing of the Johnson counter code signal <0>.

Further, the mirror delay unit b[1] inputs the pulse signal sig1 and the pulse signal sig2, and generates a preout signal [1] that rises in an intermediate phase between the pulse signal sig1 and the pulse signal sig2. That is, the mirror delay unit [1] outputs the preout signal [1] delayed from the rising of the pulse signal sig1 by a phase difference ($t_{diff}/2$) that is half a phase difference ($t_{diff}$) between the pulse signal sig1 and the pulse signal sig2. The pulse signal sig1 in this case is generated at the falling timing of the Johnson counter code signal <1>. Incidentally, since the internal circuit of the mirror delay unit b[1] is the same as that of the mirror delay unit b[0], detailed drawings thereof will be omitted.

Further, a mirror delay unit b[2] inputs the pulse signal sig2 and the pulse signal sig3, and generates a preout signal [2] that rises in an intermediate phase between the pulse signal sig2 and the pulse signal sig3. That is, the mirror delay unit b[2] outputs the preout signal [2] delayed from the rising of the pulse signal sig2 by half a phase difference ($t_{diff}/2$) of a phase difference ($t_{diff}$) between the pulse signal sig2 and the pulse signal sig3. The pulse signal sig2 in this case is generated at the falling timing of the Johnson counter code signal <2>. Incidentally, since the internal circuit of the mirror delay unit [1] is the same as that of the mirror delay unit [0], detailed drawings thereof will be omitted.

Further, a mirror delay unit b[3] inputs the pulse signal sig3 and the pulse signal sig0, and generates a preout signal [3] that rises in an intermediate phase between the pulse signal sig3 and the pulse signal sig0. That is, the mirror delay unit b[3] outputs the preout signal [3] delayed from the rising of the pulse signal sig3 by a phase difference ($t_{diff}/2$) that is half a phase difference ($t_{diff}$) between the pulse signal sig3 and the pulse signal sig0. The pulse signal sig3 in this case is generated at the falling timing of the Johnson counter code signal <3>. Incidentally, since an internal circuit of the mirror delay unit b[3] is the same as that of the mirror delay unit b[0], detailed drawings thereof will be omitted.

Example of Mixer

A mixer 160b inputs the preout signal [0], the preout signal [1], the preout signal [2], and the preout signal [3], and inputs a phase division signal OUT whose phase is inverted at an intermediate point between the phases of adjacent preout signals. Therefore, the mixer 160b inverts a signal level at the rising of the preout signal [0], maintains the inverted signal level, returns the inverted signal level to an original signal level at the rising of the preout signal [1], and maintain the original signal level. Further, the mixer 160b inverts a signal level at the rising of the preout signal [2], maintains the inverted signal level, returns the inverted signal level to an original signal level at the rising of the preout signal [3], and maintain an original signal level. The mixer 160b repeats the above operations and outputs the repeated signal level as a phase division signal OUT.

Figure 9:
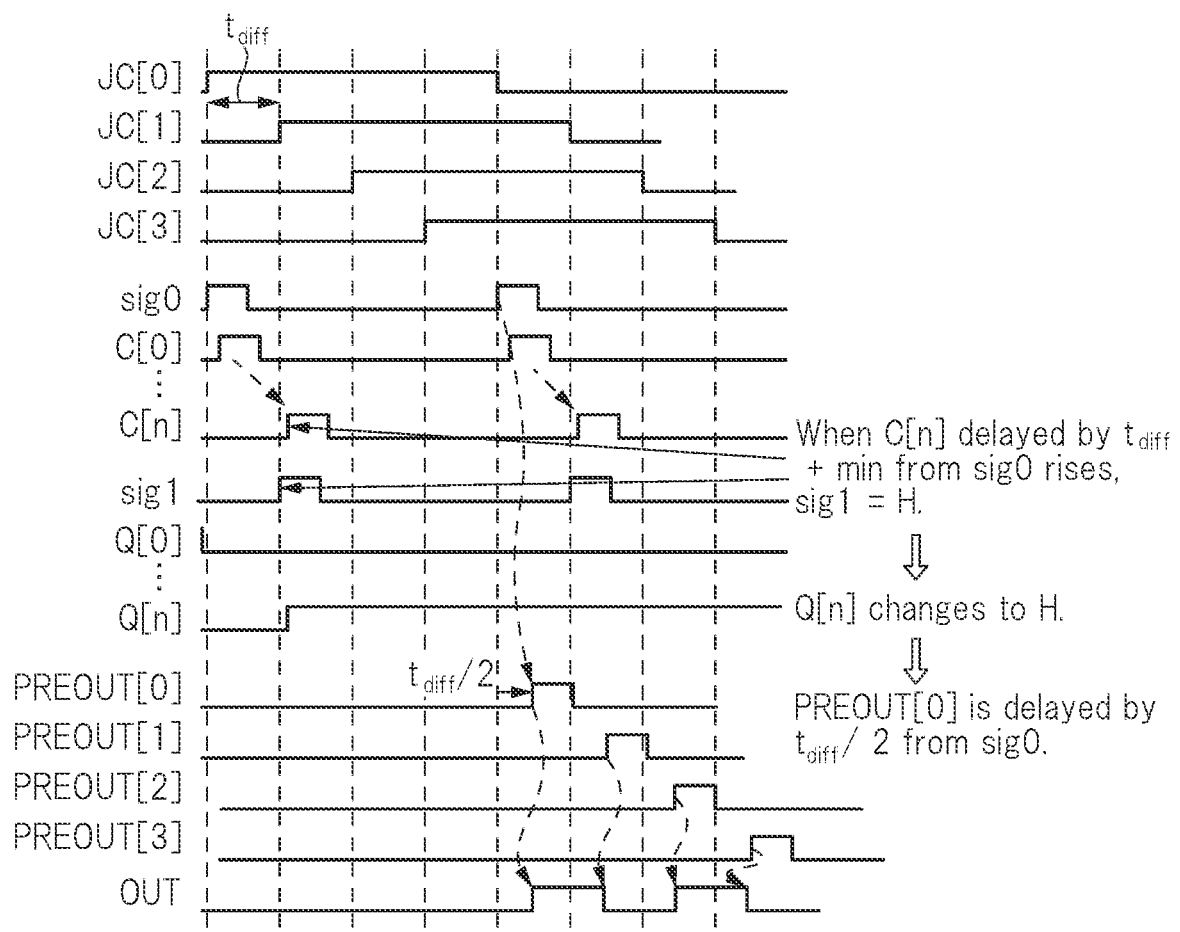
FIG. 9 is an example of a timing chart of the phase division circuit according to FIG. 8.

Example of Timing Chart of Another Phase Division Circuit According to First Embodiment FIG. 9 is an example of a timing chart of the phase division circuit related to FIG. 8. In FIG. 9, the Johnson counter code signal [0], the Johnson counter code signal [1], the Johnson counter code signal [2], and the Johnson counter code signal [3] are shifted from one another by $t_{diff}$. Further, one Johnson counter code signal is also a pulse signal having a half cycle of 4 $t_{diff}$. The pulse signal sig0 is a pulse signal having a high-level period of about ($t_{diff}/2$) and started from the rising and falling of the Johnson counter code signal [0]. Furthermore, the pulse signal sig1 is a pulse signal having a high-level period of about ($t_{diff}/2$) and started from the rising and falling of the Johnson counter code signal [1]. The delay signal C[n] is a delay signal delayed by the rising or falling of the Johnson counter code signal [0], that is, delayed only by a delay time of $t_{diff}$ the rising of the pulse signal sig0 and by a delay time of the delay circuit 120b[0]. The delay signal C[0] is a delay signal during transmission of the forward mirror delay line 130b[0]. An output terminal signal Q[n] of the D-type flip-flop DFFbn[0] outputs a signal level of the pulse signal sig1 inputted to a D terminal at the rising of the delay signal C[n]. Therefore, as shown in FIG. 9, the output terminal signal Q[n] continues to output a high state, which is the signal level of the pulse signal sig1, at the rising of the delay signal C[n]. The preout signal [0] is a signal in which a sum signal of the output terminal signal Q[n] and the pulse signal sig0 is delayed by ($t_{diff}/2$) by the backward mirror delay line 150b[0].

The phase division signal OUT outputs a signal whose output signal level is inverted at rising timing of adjacent preout signals of the preout signal [0], preout signal [1], preout signal [2], and preout signal [3] inputted to the mixer 160b. Therefore, the phase division signal OUT is a signal whose phase changes at an intermediate point between phase change points of the adjacent Johnson counter code signals. Therefore, the phase division circuit 100a and the phase division circuit 100b have functions of outputting the same phase division signal OUT except for an initial clock signal CLK portion (wakeup time of operation) inputted to the global counter.

As described above, the integrating analog-to-digital converter 1000a according to the first embodiment has a global counter 200 that outputs a counter code signal including the Johnson counter code signal and the gray code signal, which are a plurality of multiphase signals. Further, the integrated analog-to-digital converter includes a ramp wave generation circuit 300, a comparator 400a, a column circuit 900a including latch circuits 501a to 509a and 510a to 540a, and inverts an output value of the latch circuit into a digital conversion output value for each column circuit 900a. Further, the ramp wave generation circuit 300 outputs a ramp wave voltage whose voltage value changes linearly according to time variation. Furthermore, the comparator 400a compares the ramp wave voltage with a pixel voltage generated by the pixel. In addition, the latch circuits 501a to 509a and 510a to 540a latch a counter code signal(s) at timing when an output of the comparator 400a is inverted.

The above-mentioned integrating analog-to-digital converter 1000a includes a phase division circuit 100a that inputs a counter code signal, generates a phase division signal for dividing a phase of the counter code signal, and outputs the phase division signal to the latch circuit 600a as a LSB of a digital conversion output value of the integrating analog-to-digital converter. The global counter 200 is used for a predetermined number of column circuits 900. As an example of the predetermined number, numbers of several thousands are given. That is, the global counter 200 may be used for several thousand column circuits 900. Further, the phase division circuit 100a may be arranged for a plurality of column circuits having a number smaller than the predetermined number, and the LSB signal may be used by a plurality of phase division circuits. As an example of the plurality of column circuits, one to several hundred column circuits, preferably, several ten to several hundred column circuits are given. Incidentally, the above configuration is common not only to the integrating analog-to-digital converter of the first embodiment but also to integrating analog-to-digital converters of a second and third embodiments described in detail below.

According to the integrated analog-to-digital converter having the above configuration, appropriately combining the counter code signals and appropriately arranging the phase division circuits, which generate high-speed signals, locally in the column at appropriate intervals make it possible to perform an analog-to-digital conversion processing at a higher speed than the frequency of the counter code signal.

Second Embodiment

Example of Phase Division Circuit According to Second Embodiment

Figure 10:
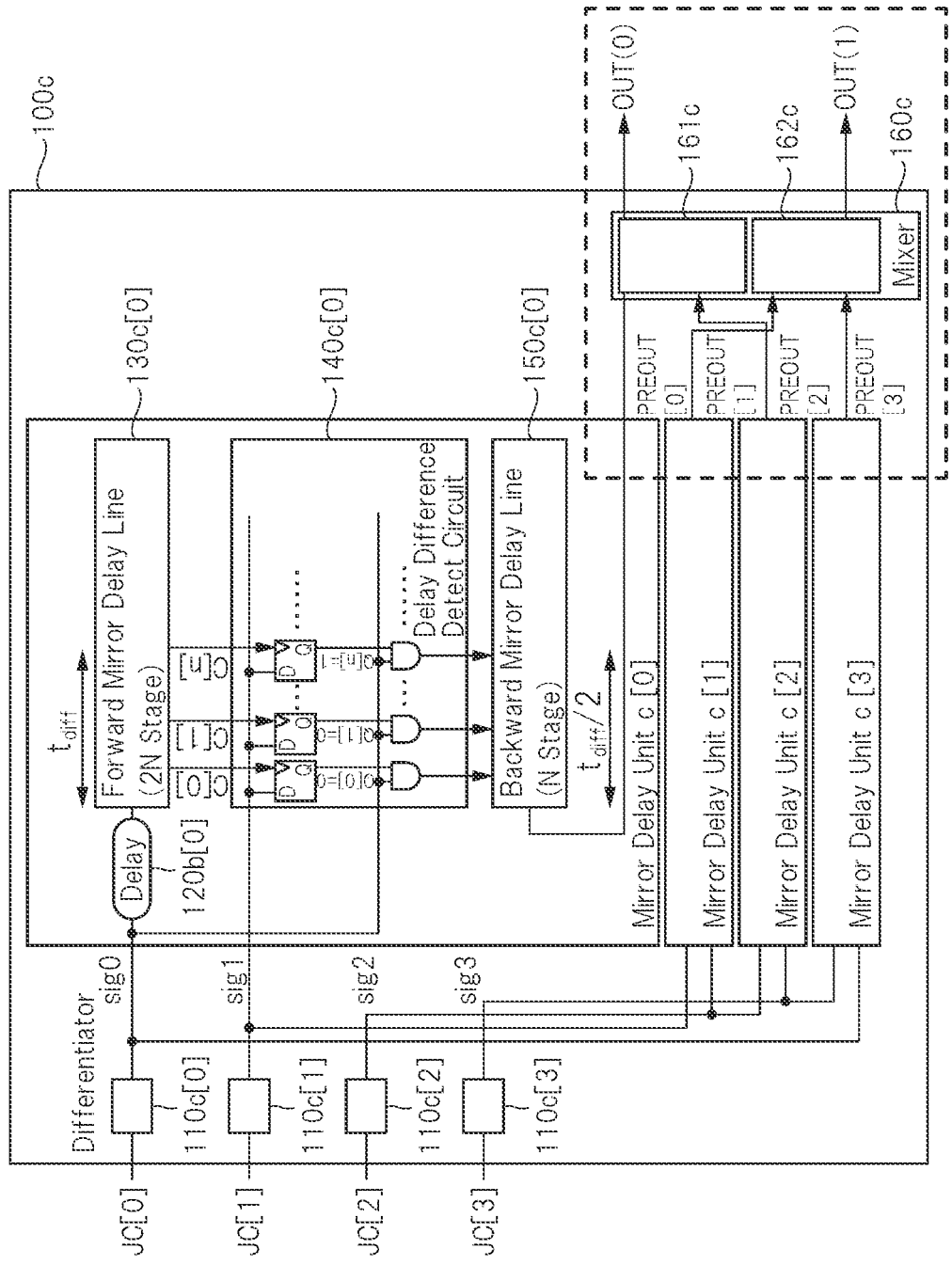
FIG. 10 is a block diagram of an example of a phase division circuit according to a second embodiment.

FIG. 10 is a block diagram of an example of a phase division circuit according to a second embodiment. Similar to the phase division circuit 100b according to the first embodiment, a phase division circuit 100c according to a second embodiment functions as an SMD circuit that inputs the Johnson counter code signals <0> to <3> having four different phases. The phase division circuit 100c has a configuration different from the phase division circuit 100b in a configuration of a mixer 160c. Since the configurations other than that of the mixer 160c are the same for the phase division circuit 100b and the phase division circuit 100c, a description thereof will be omitted in order to avoid duplication of the description.

The mixer 160c of the phase division circuit 100c according to the second embodiment is configured to output a phase division signal in two phases. That is, a frequency of the phase division signal of the phase division circuit 100c becomes ½ of the frequency of each phase division signal of the phase division circuit 100a and the phase division circuit 100b according to the second embodiment. Like this, by lowering the frequency of the phase division signal, it is expected that the transmission of the phase division signal will be stabilized by reducing noise and reducing erroneous transmission.

Specifically, the mixer 160c includes a mixer 161c and a mixer 162c. The mixer 161c inputs a preout signal [0] and a preout signal [2], and outputs a phase division signal 0 OUT (0). The mixer 162c inputs a preout signal [1] and a preout signal [3], and outputs a phase division signal 0 OUT (0).

The phase division signal 0 OUT (0) repeats an operation in which its phase is inverted at the rising of the preout signal [0] and the phase is originally returned at the rising of the preout signal [2]. That is, the phase of OUT (0) changes at a midpoint of a phase change between the Johnson counter code signal [0] and the Johnson counter code signal [1], and changes at a midpoint of a phase change between the Johnson counter code signal [2] and the Johnson counter code signal [3].

Further, a phase division signal 1 OUT (1) repeats an operation in which its phase is inverted at the rising of the preout signal [1] and the phase is originally returned at the rising of the preout signal [3]. That is, the phase of OUT (1) changes at a midpoint of a phase change between the Johnson counter code signal [1] and the Johnson counter code signal [2], and changes at a midpoint of a phase change between the Johnson counter code signal [3] and the Johnson counter code signal [0].

The LSB of the second embodiment is expressed by 2 bits in parallel with the phase division signal 0 OUT (0) and the phase division signal 1 OUT (1), and a LSB frequency is lowered. As described above, by lowering the frequency of the phase division signal, it is expected that the transmission of the phase division signal is stabilized by reducing the noise and reducing the erroneous transmission.

Figure 11:
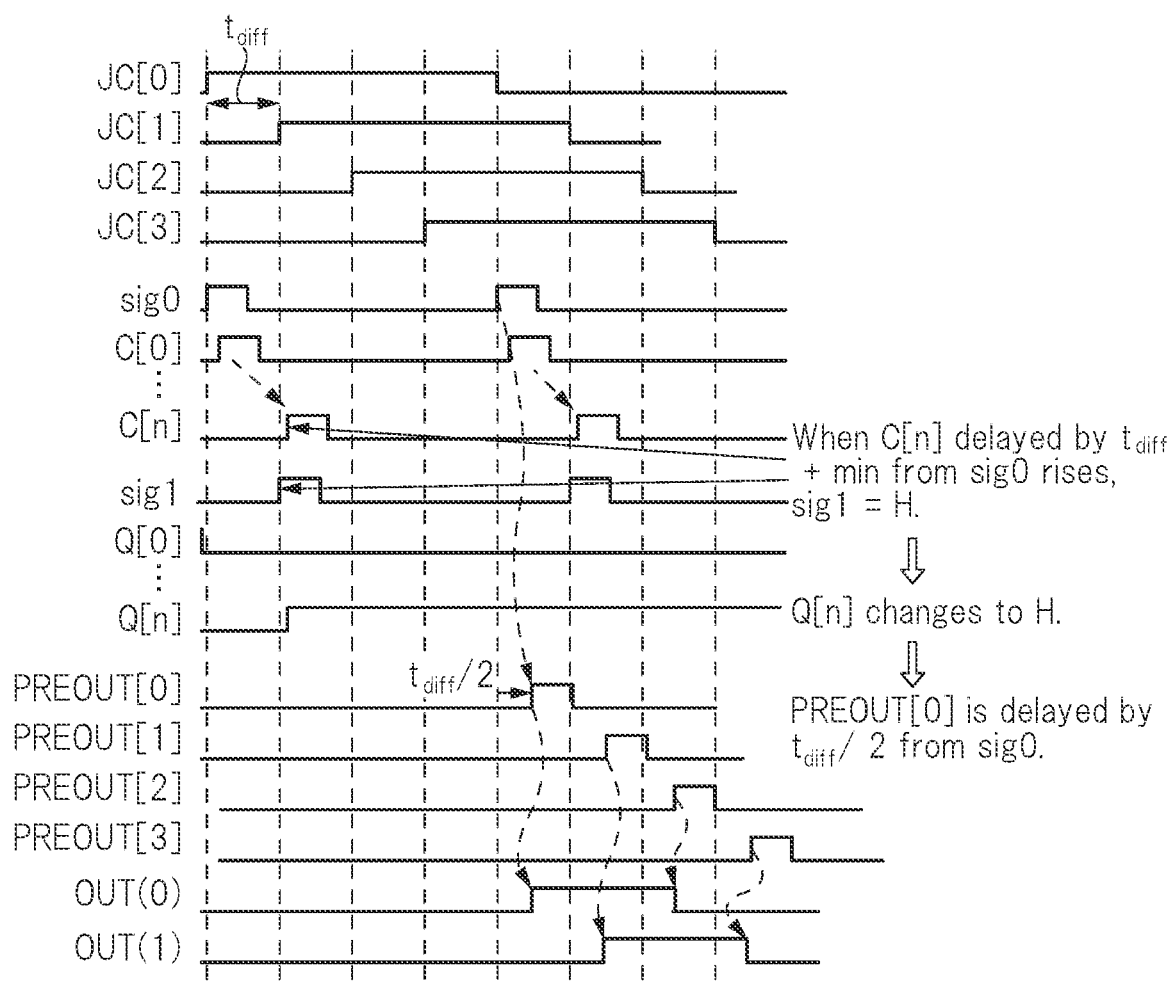
FIG. 11 is a timing chart of an example of the phase division circuit related to FIG. 10.

Example of Timing Chart of Phase Division Circuit
According to Second Embodiment FIG. 11 is a timing chart of an example of a phase division circuit related to FIG. 10. That is, in FIG. 11, the Johnson counter code signal [0], the Johnson counter code signal [1], the Johnson counter code signal [2], and the Johnson counter code signal [3] are shifted from one another by $t_{diff}$. Further, one Johnson counter code signal is also a pulse signal having a half cycle of 4 $t_{diff}$. The pulse signal sig0 is a pulse signal having a high-level period of about ($t_{diff}/2$) and started from the rising and falling of the Johnson counter code signal [0].

Furthermore, the pulse signal sig1 is a pulse signal having a high-level period of about ($t_{diff}/2$) started from the rising and falling of the Johnson counter code signal [1]. The delay signal C[n] is a delay signal delayed by the rising or falling of the Johnson counter code signal [0], that is, delayed only by $t_{diff}$ from the rising of the pulse signal sig0 and by a delay time of the delay circuit 120b[0]. The delay signal C[0] is a delay signal during the transmission of the forward mirror delay line 130b[0]. An output terminal signal Q[n] of the D-type flip-flop DFFbn[0] outputs a signal level of the pulse signal sig1 inputted to a D terminal at the rising of the delay signal C [n]. Therefore, as shown in FIG. 10, the output terminal signal Q[n] continues to output a high state, which is the signal level of the pulse signal sig1, at the rising of the delay signal C[n]. The preout signal [0] is a signal in which a sum signal of the output terminal signal Q[n] and the pulse signal sig0 is delayed by ($t_{diff}/2$) by the backward mirror delay line 150b[0].

The phase division signal 0 OUT (0) repeats an operation in which its phase is inverted at the rising of the preout signal [0] and the phase is originally returned at the rising of the preout signal [2]. Further, the phase division signal 1 OUT (1) repeats an operation in which its phase is inverted at the rising of the preout signal [1] and the phase is originally returned at the rising of the preout signal [3].

Figure 12:
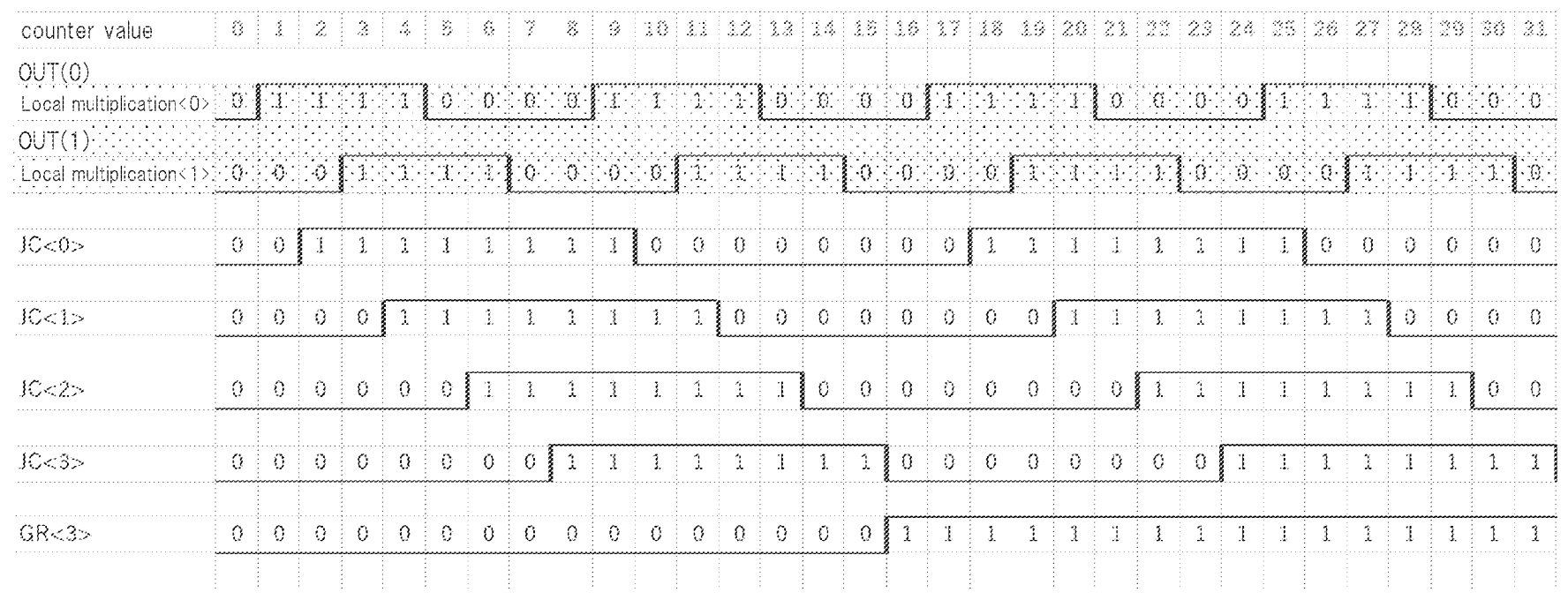

Example of Output Bit Pattern of Analog-to-Digital
Converter According to Second Embodiment FIG. 12 is a timing chart showing an example of an output bit pattern of the analog-to-digital converter according to the second embodiment. That is, FIG. 12 shows: a Johnson counter code signal JC<0> to a Johnson counter code signal JC<3> that output middle-order 4 bits from above the LSB of the analog-to-digital converter according to the second embodiment; a gray code signal <3> which is 1 bit of a high-order bit; and a phase division signal of the LSB. The phase division signal of the LSB has two phases and is represented by the phase division signals OUT (0) and OUT (1).

An upper-stage counter value of FIG. 12 indicates the number of clocks of the clock signal CLK inputted to the global counter 200. Therefore, when the counter value of the clock signal CLK is "0", the input of the integrating analog-to-digital converter 1000a leads to nothing. Therefore, it satisfies the phase division signals 0 OUT (0) and (1)="0", the Johnson counter code signal JC<0> to the Johnson counter code signal JC<3>="0", and the other bits="0". Each time the counter value is incremented, a phase division signal whose phase changes at an intermediate position where the phase of the adjacent Johnson counter code signal changes is generated. That is, the phase division signal becomes a signal having a frequency of twice an edge change of the Johnson counter code signal. Like this, since the phase division signal outputs a high-speed signal changing in the intermediate phase of the Johnson counter code signal which is a multiphase clock, it can reduce the probability of erroneous counting. Further, since the phase division circuit can be designed to be arranged adjacent to the circuit requiring the high-speed operation as needed, the phase division signal can be supplied over a short distance and with a low load. Moreover, in the present embodiment, since the phase division signal is represented by two phases and the phase division signals OUT (0) and (1), the phase division signal can be lowered in its speed by ½ times in comparison with the first embodiment representing the phase division signal by one phase.

Therefore, the phase division signal can be configured to input the counter code signal such as a plurality of Johnson counter code signals and represent the LSB by a single (first embodiment) or a plurality of (second embodiment etc.) phase division signals.

According to such an operation, the execution speed of the analog-to-digital converter can be made twice or more than the conventional execution speed without increasing the frequency of the clock signal CLK inputted to the global counter 200. Further, the execution speed of the analog-to-digital converter can be made twice or more than the conventional execution speed without increasing the frequency of the counter code signal transmitted over a long distance and outputted from the global counter 200. That is, the analog-to-digital converter according to the present embodiment responds to user demands such as improvement of the frame rate of an imaging element (not shown) connected to the input of the analog-to-digital converter, the increase in the number of pixels, and improvement in image quality. Furthermore, the analog-to-digital converter can be speeded up without increasing the chip area of the analog-to-digital converter and the assembly cost.

Third Embodiment

Example of Phase Division Circuit According to
Third Embodiment

Figure 13:
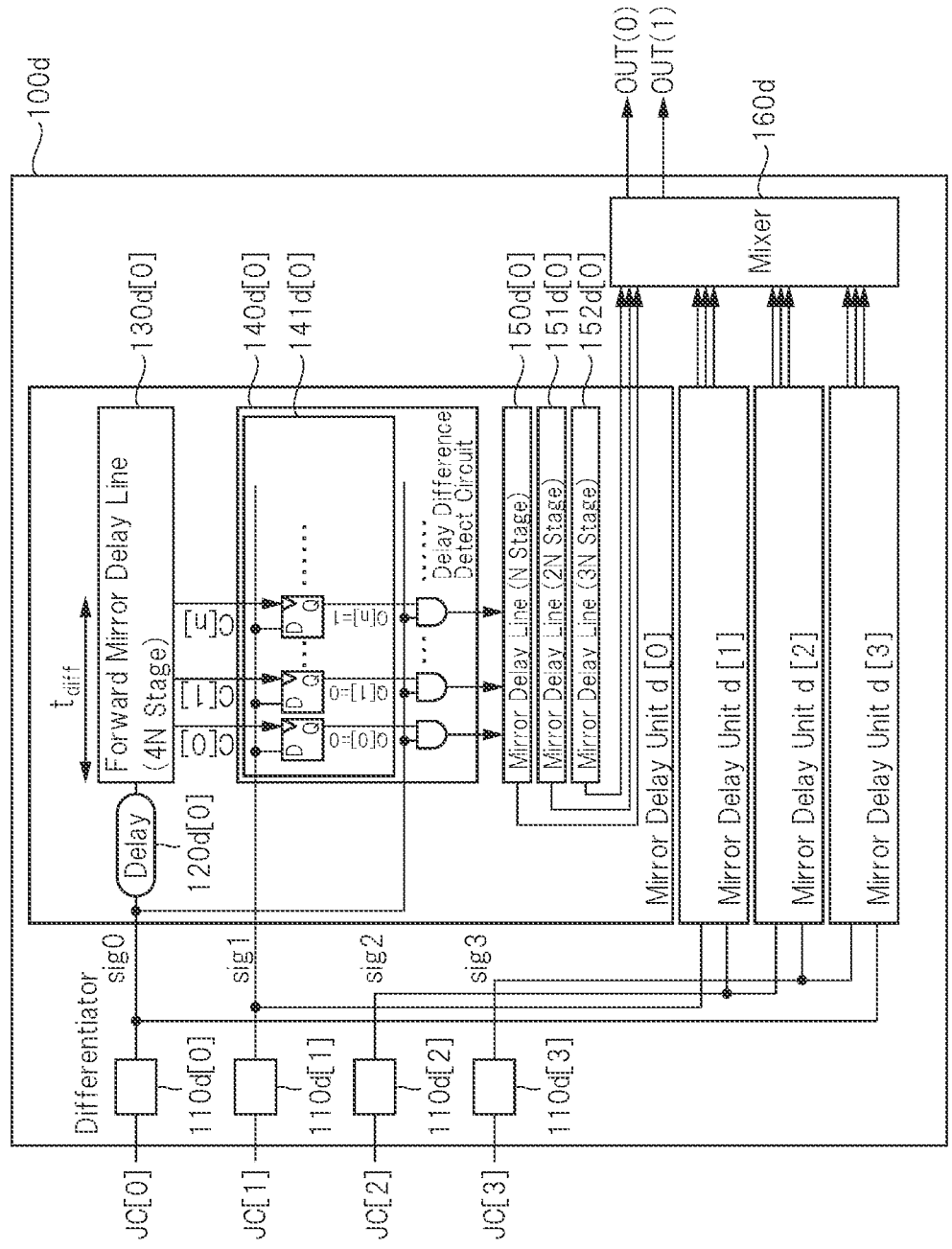
FIG. 13 is a block diagram of an example of a phase division circuit according to a third embodiment.

FIG. 13 is a block diagram of an example of a phase division circuit according to a third embodiment. Similar to the phase division circuit 100c according to the second embodiment, a phase division circuit 100d according to a third embodiment functions as an SMD circuit that inputs the Johnson counter code signals <0> to <3> having four different phases. The phase division circuit 100d has a configuration different from the phase division circuit 100c in a configuration of a mixer 160d, a mirror delay circuit 150d, and the like. Since configurations other than the mixer 160d and the mirror delay circuit 150d are the same for the phase division circuit 100c and the phase division circuit 100d, a description thereof will be omitted in order to avoid duplication of the description.

The mixer 160d of the phase division circuit 100d according to the third embodiment has a configuration in which a phase division signal is outputted in two phases similarly to the second embodiment. The mixer 160d inputs a preout signal [1], a preout signal [2], a preout signal [3], and a preout signal [4], and outputs a phase division signal 1 OUT (1). Similarly to the phase division signal of the first embodiment, the phase division signal 1 OUT (1) becomes a signal whose phase changes at a midpoint of a phase change point between the adjacent Johnson counter code signals. Further, the mixer 160d outputs a phase division signal 0 OUT (0). The phase division signal 0 OUT (0) becomes a signal whose phase changes at ¼ and ¾ phase points between the phase change points of the adjacent Johnson counter code signals. That is, a two-phase phase division signal of the phase division circuit 100d according to the third embodiment divides the phase change points of the adjacent Johnson counter code signals into four, thereby becoming a signal in which a conversion speed of the conventional analog-to-digital converter is made 4 times speed-up. However, since the frequencies of the Johnson counter code signals in the first, second, and third embodiments do not change, it is expected that stability of the signal transmitted over a long distance does not change.

The mirror delay circuit 150d[0] outputs, to the mixer 160d, a signal obtained by delaying the pulse signal sig1 by ¼ phase. A mirror delay circuit 151d[0] outputs, to the mixer 160d, a signal obtained by delaying the pulse signal sig1 by ²⁄4 phase. The mirror delay circuit 152d[0] outputs, to the mixer 160d, a signal obtained by delaying the pulse signal sig1 by ¾ phase. Similarly, a mirror delay unit d[1] outputs a signal obtained by delaying the pulse signal sig0 in ¼ phase, a mirror delay unit d [2] outputs a signal obtained by delaying the pulse signal sig3 in ²⁄4 phase, and a mirror delay unit d[3] outputs a signal obtained by delaying the pulse signal sig3 in ¾ phase.

The mixer 160d outputs the phase division signal 0 OUT (0) to the phase division signal 1 OUT (1) by the above signals outputted from the mirror delay circuit 150d[0] to the mirror delay circuit 150d[3]. That is, the phase division signal can be configured to input a plurality of counter code signals and change a phase of the phase division signal at an arbitrary position between the phase change points of the plurality of counter code signals by changing the delay time of the mirror delay circuit.

Figure 14:
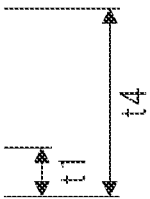
FIG. 14 is a timing chart showing an example of an output bit pattern of an analog-to-digital converter according to the third embodiment.

Example of Output Bit Pattern of Analog-to-Digital Converter According to Third Embodiment FIG. 14 is a timing chart showing an example of an output bit pattern of the analog-to-digital converter according to the third embodiment. That is, FIG. 14 shows: a Johnson counter code signal JC<0> to the Johnson counter code signal JC<3> which output middle-order 4 bits from above the LSB of the analog-to-digital converter according to the third embodiment; a gray code signal <3> which is 1 bit of a high-order bit; and a phase division signal of the LSB. The phase division signal of the LSB has two phases and is represented by the phase division signals OUT (0) and OUT (1). The LSB signal may also be referred to as a local multiplication signal.

An upper-stage counter value of FIG. 14 indicates the number of clocks of the clock signal CLK inputted to the global counter 200. Therefore, when the counter value of the clock signal CLK is "0", the input of the integrating analog-to-digital converter 1000a leads to nothing. In this case, the phase division signals OUT (0) and (1)="0", the Johnson counter code signal JC<0> to the Johnson counter code signal JC<3>="0", and the other bits="0" are satisfied. Each time the counter value is incremented four times, the phase division signal OUT (1) generates a phase division signal whose phase changes at an intermediate position where the phases of the adjacent Johnson counter code signals change. Further, each time the counter value is incremented twice, the phase division signal OUT (0) generates a phase division signal whose phase changes at a ¼ phase point and a ¾ phase point while the phases of the adjacent Johnson counter code signal change. Therefore, when the phase division signals OUT (0) and OUT (1) are arranged in parallel, a signal appears, a phase of the signal changing every ¼ phase while the phases of the adjacent Johnson counter code signals change. That is, the two-phase phase division signal of the phase division circuit 100d according to the third embodiment divides the phase change points of the adjacent Johnson counter code signals into four, so that it becomes a signal making the conversion speed of the conventional analog-to-digital converter four times speed-up. Like this, since the phase division signal outputs a high-speed signal that changes by dividing into four by an intermediate phase of the Johnson counter code signal which is a multiphase clock, the probability of erroneous counting can be reduced. Furthermore, since the phase division circuit can be designed to be arranged adjacent to the circuit requiring the high-speed operation as needed, the phase division signal can be supplied over a short distance and with a low load. Moreover, in the present embodiment, since the phase division signal is represented by two phases, that is, the phase division signals OUT (0) and (1), the speed of the phase division signal can be lowered ½ times in comparison with the embodiment in which the phase division signal is represented by one phase.

According to such an operation, the execution speed of the analog-to-digital converter can be made four times or more than the conventional execution speed thus far without increasing the frequency of the clock signal CLK inputted to the global counter 200. Further, the execution speed of the analog-to-digital converter can be made twice of more than the conventional execution speed thus far without increasing the frequency of the counter code signal transmitted over a long distance and outputted from the global counter 200. That is, the analog-to-digital converter according to the present embodiment can respond to user demands such as improvement of the frame rate of an imaging element (not shown) connected to the input of the analog-to-digital converter, an increase in the number of pixels, and improvement in image quality. Furthermore, the analog-to-digital converter can be speeded up without increasing the chip area of the analog-to-digital converter and the assembly cost.

Comparative Example of Output Bit Pattern of Analog-to-Digital Converter

Figure 15:
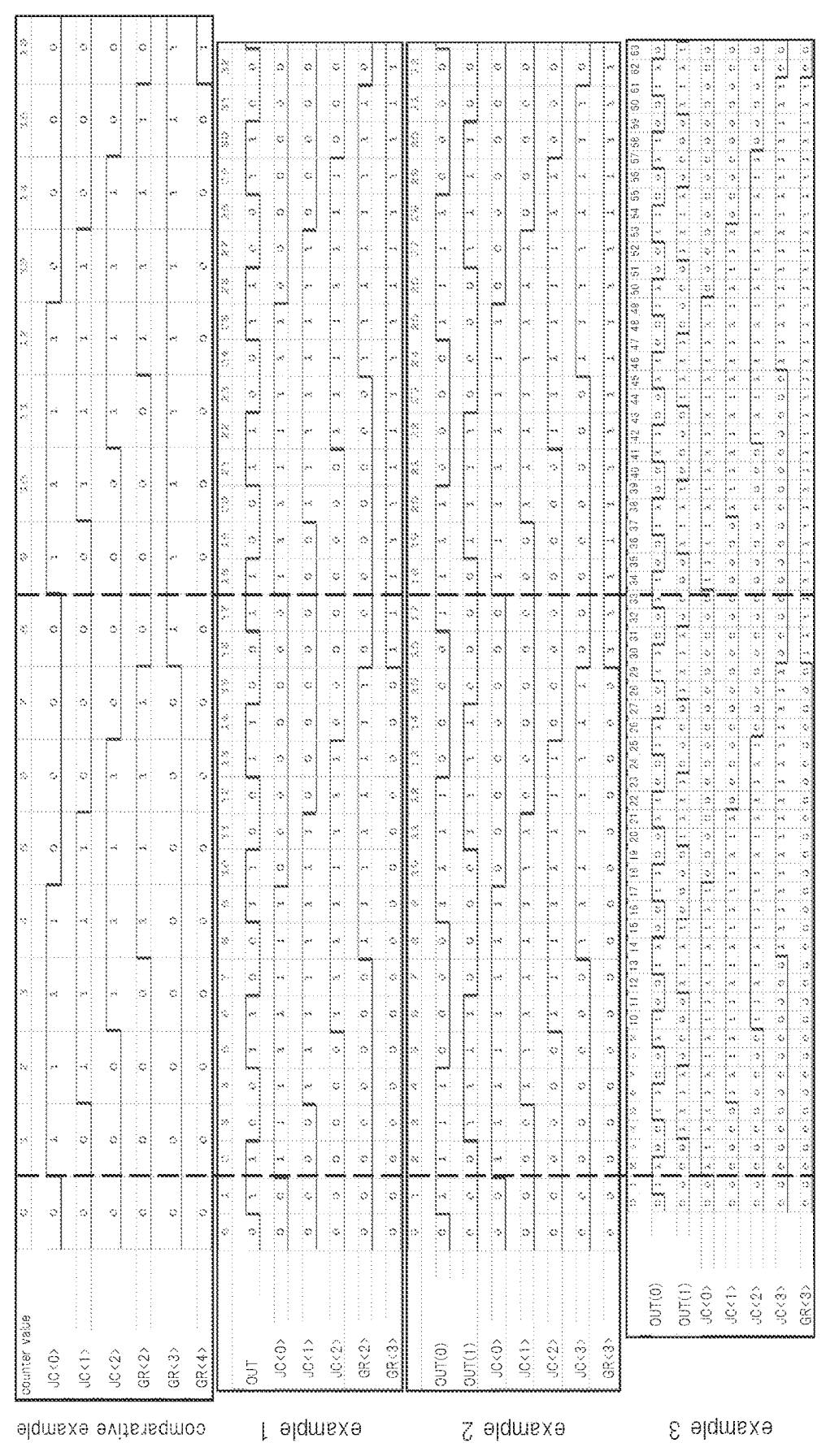

FIG. 15 is a timing chart showing a comparative example and a comparative example of an output bit pattern of the analog-to-digital converter of the present embodiment. An upper stage of FIG. 15 is a comparative example and is an example of an output bit pattern of the conventional analog-to-digital converter, and shows a Johnson counter code signal JC<0> to JC <2>, gray code signals GR<3> and GR<4> for comparison. A counter value of the clock signal inputted to the global counter is shown at the uppermost stage of a comparative example. That is, in the comparative example in the uppermost stage of FIG. 15, one cycle of the Johnson counter code signal JC<0>, which is a long-distance transmission signal, indicates a period of an 8-LSB signal.

Each of middle and upper stages of FIG. 15 is an example of an output bit pattern of the analog-to-digital converter including the phase division circuit 100a of the first embodiment. Since the phase of the phase division signal of the first embodiment changes at an intermediate position where the phases of the adjacent Johnson counter code signals change, the phase division signal can perform twice speed-up conversion in comparison with the analog-to-digital converter of the comparative example. That is, one cycle of the Johnson counter code signal JC<0>, which is a long-distance transmission signal, indicates a period of a 16-LSB signal.

Each of middle and lower stages of FIG. 15 is an example of an output bit pattern of the analog-to-digital converter including the phase division circuit 100c of the second embodiment. Since the phase of the phase division signal of the second embodiment changes at an intermediate position where the phases of the adjacent Johnson counter code signals change in two phases, the phase division signal can perform twice speed-up conversion in comparison with the analog-to-digital converter of the comparative example and, at the same time, the frequency of the phase division signal is lowered. That is, one cycle of the Johnson counter code signal JC<0>, which is a long-distance transmission signal, indicates a period of a 16-LSB signal, but the frequency of the two-phase phase division signal is reduced to ½ of the frequency of the phase division signal of the first embodiment, which realizes improvement in stability of circuit transmission and a reduction in power consumption.

A lower stage of FIG. 15 is an example of an output bit pattern of the analog-to-digital converter including the phase division circuit 100d of the third embodiment. The phase division signal of the third embodiment has two phases, and includes a phase division signal 1 whose phase changes at an intermediate position where the phases of the adjacent Johnson counter code signals change. Further, the phase division signal of the third embodiment has two phases, and includes a phase division signal 0 whose phase changes at a ¼-phase position and a ¾-phase position while the phases of the adjacent Johnson counter code signals change. Therefore, when the phase division signals 0 and 1 are arranged in parallel, a bit pattern appears, a phase changing every ¼ phase in the bit pattern while the phases of the adjacent Johnson counter code signals change. That is, the two-phase phase division signal of the phase division circuit 100d according to the third embodiment divides phase change points of the adjacent Johnson counter code signals into four, so that the conversion speed of the conventional analog-to-digital converter is speeded-up four times. Therefore, one cycle of the Johnson counter code signal JC<0>, which is a long-distance transmission signal, indicates a period of a 32-LSB signal.

According to a feature(s) common to the above-mentioned output patterns, the phase division circuit generating a signal faster than the global counter code signal that determines an operating frequency of the semiconductor device can be arranged in the column. As a result, the semiconductor device can operate faster than the global counter code signals. Further, since the input of the phase division circuit can use a plurality of relatively low-speed Johnson counter code signals, it can withstand long-distance transmission and high-load transmission. Furthermore, since the phase division signal of the phase division circuit outputs a high-speed signal changing in the intermediate phase of the Johnson counter code signal which is a multiphase clock, the probability of erroneous counting can be reduced. In addition, since the phase division circuit can be designed to be arranged adjacent to the circuit requiring the high-speed operation as needed, the phase division signal can be supplied over a short distance and with a low load.

First Modification Example

In the first to third embodiments, a method of applying the phase division signal of the phase division circuit to the LSB of the analog-to-digital converter has been described. However, the output signal of the analog-to-digital converter may be image-processed by an image processing circuit. In this case, the image processing circuit may be realized by the semiconductor circuit, and an image processing device as a semiconductor device may be realized by the analog-to-digital converter and the image processing circuit. That is, a first modification example is applied to a case of providing a semiconductor device such as an image processing device, the semiconductor device including: the integrating analog-to-digital converter according to any one of the first to third embodiments; and a semiconductor circuit such as an image processing circuit.

According to the semiconductor device having the above configuration, it is possible to increase the number of pixels of the imaging element, improve the image quality by increasing the number of gradations or the like, prevent the unevenness of the image quality, and prevent the streaky image from being generated.

Second Modification Example

In the first to third embodiments and the first modification example, the configuration in which the phase division signal of the phase division circuit is applied to the imaging element has been described. However, in a semiconductor device having a plurality of column circuits in parallel and operating the column circuits by the counter code signal from the global counter, the column circuit that requires the signal with the high frequency may be locally arranged. In such a case, the configuration in which the phase division circuit is arranged in the column circuit or in the vicinity of the column circuit and the phase division signal operating at the high frequency is supplied to the column circuit is effective to all the column circuits where the high-frequency signals are not needed. For example, an example of the semiconductor device is a memory semiconductor device such as DRAM or SRAM.

That is, the above-mentioned semiconductor device is a semiconductor device that includes the column circuit driven by the counter code signal generated by the global counter being transmitted across the column circuit in the previous stage and in which the plurality of column circuits are connected in parallel. Further, the above-mentioned semiconductor device includes the phase division circuit generating a phase division signal whose phase changes at an arbitrary position between the phase change points of the counter code signal when the counter code signal is a multiphase counter code signal. The phase division circuit is preferably arranged in the column circuit, which uses a frequency higher than the frequency of the counter code signal, or within one to several hundred column circuits from the above column circuit. According to this configuration, the phase division circuit can be arranged in or in the vicinity of the column circuit that locally requires a high frequency signal, and the low-load and high-speed phase division signal can be supplied in a range where a transmission distance is short.

Although the invention made by the present inventors has been specifically described above based on the embodiments, the present invention is not limited to the above embodiments and, needless to say, various changes or modifications can be made without departing from the scope thereof. Further, for example, the above-described embodiments have been described in detail in order to make it easy to explain the present invention, and is not necessarily limited to the one including all the described configurations. Furthermore, it is possible to add, delete, or/and replace a part of the configuration of the above embodiments to, from, or/and with another configuration.

In addition, each of the above configurations, functions, processing units, and processing means, etc. may be realized with hardware by designing a part or all of them by, for example, an integrated circuit. Further, each of the above configurations, functions, and the like may be realized by software by a processor interpreting and executing a program that realizes each a function. Information such as programs, tables, and files that realize each function can be placed in a memory, a hard disk, a recording device such as an SSD (Solid State Drive), or a recording medium such as an IC card, an SD card, or a DVD.

Although the invention made by the present inventors has been specifically described above based on the embodiments, the present invention is not limited to the above embodiments and, needless to say, can be variously modified and changed without departing from the scope thereof.

What is claimed is:

1. An integrating analog-to-digital converter comprising:
    a global counter outputting a counter code signal including a multiphase signal;
    a column circuit including:
        a ramp wave generation circuit outputting a ramp wave voltage whose voltage value changes linearly according to time change;
        a comparator comparing the ramp wave voltage with a pixel voltage generated by a pixel; and
        a latch circuit latching the counter code signal at timing at which an output of the comparator is inverted;
    an output value of the latch circuit being converted into a digital conversion output value per the column circuit; and
    a phase division circuit inputting the counter code signal, generating a phase division signal that divides a phase of the counter code signal, and outputting the phase division signal to the latch circuit as an LSB of the digital conversion output value of the integrating analog-to-digital converter,
    wherein the global counter is shared to a predetermined number of the column circuit, and
    wherein the phase division circuit is arranged for a plurality of column circuits composed of the column circuit, the number of column circuits being a number smaller than the predetermined number, and the LSB is shared by a plurality of phase division circuits composed of the phase division circuit.

2. The integrating analog-to-digital converter according to claim 1,
    wherein the phase division circuit is arranged per one to several hundred column circuits from the global counter.

3. The integrating analog-to-digital converter according to claim 1,
    wherein the phase division circuit is arranged in a column circuit that operates at a speed higher than operating frequencies of adjacent column circuits, or is arranged within one to several hundred column circuits from the column circuit.

4. The integrating analog-to-digital converter according to claim 1,
    wherein the phase division signal is configured to input a plurality of counter code signals composed of the counter code signal and represent the LSB by single or more of a plurality of phase division signals composed of the phase division signal.

5. The integrating analog-to-digital converter according to claim 1,
    wherein the phase division signal is configured to input a plurality of counter code signals composed of the counter code signal and change a phase of the phase division signal at an arbitrary position between phase change points of the plurality of counter code signals.

6. The integrating analog-to-digital converter according to claim 1,
    wherein a counter code signal inputted to the phase division circuit is a Johnson counter code signal, counter code signals adjacent to each other are different from each other in ⅛ cycle phase and each have a duty of 50%, and four Johnson counter codes, which are different from one another in ⅛ cycle phase, are inputted in the phase division circuit in parallel.

7. The integrating analog-to-digital converter according to claim 1,
    wherein a counter code signal, which is not inputted in the phase division circuit and corresponds to an output value of the latch circuit to be a high-order bit of the digital conversion output value of the integrating analog-to-digital converter, is a gray code signal.

8. A semiconductor device comprising:
    the integrating analog-to-digital converter according to claim 1; and
    a semiconductor circuit.

9. A semiconductor device including a column circuit driven by a counter code signal, which is generated by a clock generator, being transmitted across the column circuit in a previous stage, a plurality of column circuits composed of the column circuit being connected in parallel, the semiconductor device comprising:
    a phase division circuit generating a phase division circuit whose phase is changed at an arbitrary position between phase change points of the counter code signal when the counter code signal is a multiphase counter code signal,
    wherein the phase division circuit is arranged in the column circuit, which uses a frequency higher than a frequency of the counter code signal, or arranged within a range of one to several hundred column circuits from the column circuit.

* * * * *